(12) United States Patent
Yan et al.

(10) Patent No.: US 8,513,900 B2
(45) Date of Patent: Aug. 20, 2013

(54) APPARATUS FOR TUNING OF EMITTER WITH MULTIPLE LEDS TO A SINGLE COLOR BIN

(75) Inventors: Xiantao Yan, Palo Alto, CA (US); Kachun Lee, Fremont, CA (US)

(73) Assignee: Ledengin, Inc., San Jose, CA (US)

( * ) Notice: Subject to any disclaimer, the term of this patent is extended or adjusted under 35 U.S.C. 154(b) by 209 days.

(21) Appl. No.: 13/106,810

(22) Filed: May 12, 2011

(65) Prior Publication Data
US 2012/0286699 A1 Nov. 15, 2012

(51) Int. Cl.
*H05B 37/02* (2006.01)
(52) U.S. Cl.
USPC .......................... 315/294; 315/151
(58) Field of Classification Search
None
See application file for complete search history.

(56) References Cited

U.S. PATENT DOCUMENTS

| | | | |
|---|---|---|---|
| 6,967,447 B2 * | 11/2005 | Lim et al. | 315/291 |
| 2010/0060185 A1 * | 3/2010 | Van Duijneveldt | 315/287 |
| 2011/0012512 A1 | 1/2011 | Young et al. | |

OTHER PUBLICATIONS

Office Action mailed Apr. 12, 2013 in U.S. Appl. No. 13/106,808, 10 pages.

* cited by examiner

*Primary Examiner* — Crystal L Hammond
(74) *Attorney, Agent, or Firm* — Kilpatrick Townsend & Stockton LLP

(57) ABSTRACT

An apparatus is used to tune the color produced by an LED-based lamp to a desired color or color temperature. To support tuning, the lamp can include two or more independently addressable groups of LEDs. Color or color temperature is tuned by controllably dividing an input current among the groups of LEDs. The apparatus determines an optimal division of the input current based on a linear interpolation between measured values of color or color temperature produced by at least two different divisions of the input current.

20 Claims, 16 Drawing Sheets

APPARATUS FOR TUNING OF EMITTER WITH MULTIPLE LEDS TO A SINGLE COLOR BIN

CROSS-REFERENCE TO RELATED APPLICATION

This disclosure is related to commonly-assigned co-pending U.S. application Ser. No. 13/106,808, filed of even date herewith, which disclosure is incorporated by reference herein.

BACKGROUND OF THE INVENTION

The present invention relates in general to lamps based on light-emitting diodes (LEDs) and in particular to procedures for tuning the color of light produced by lamps that include multiple LEDs.

With the incandescent light bulb producing more heat than light, the world is eager for more efficient sources of artificial light. LEDs are a promising technology and are already widely deployed for specific purposes, such as traffic signals and flashlights. However, the development of LED-based lamps for general illumination has run into various difficulties. Among these is the difficulty of mass-producing lamps that provide a consistent color temperature.

As is known in the art, not all white light is the same. The quality of white light can be characterized by a color temperature, which ranges from the warm (slightly reddish or yellowish) glow of standard tungsten-filament light bulbs to the cool (bluish) starkness of fluorescent lights. Given existing processes for LED manufacture, mass-producing white LEDs with a consistent color temperature has proven to be a challenge.

Various solutions have been tried. For example, white LEDs can be binned according to color temperature and the LEDs for a particular lamp can be selected from the desired bin. However, the human eye is sensitive enough to color-temperature variation that a large number of bins is required, with the yield in any particular bin being relatively low.

Another solution relies on mixing different colors of light to produce a desired temperature. For example, an LED lamp can include a number of white LEDs plus some red LEDs. The brightness of the red LEDs can be increased to warm the light to the desired color temperature. Such lamps generally require an active feedback mechanism to maintain the color temperature, in part because the LEDs used are not stable in their color characteristics over time. The active feedback mechanism requires a sensor to detect the light being produced, an analyzer to determine whether the light is at the desired color, and an adjustment mechanism to adjust the relative brightness of the white and red LEDs as needed to maintain the desired color. These feedback-loop elements can be a weak point in the system; for example, if the light sensor drifts over time (as most do), so will the color of the light. In addition, incorporating active feedback components into a lamp drives up the cost of manufacturing (and operating) the lamp.

BRIEF SUMMARY OF THE INVENTION

Embodiments of the present invention relate to apparatus and techniques for tuning the color of an LED-based lamp to a desired color or color temperature. Particular embodiments are adapted for use with lamps that include two or more independently addressable groups of LEDs that each produce light of a different color or color temperature. The lamps can also include a total-internal-reflection (TIR) color-mixing lens to produce light of a uniform color by mixing the light from the different groups of LEDs. The uniform color or color temperature output from the lamp is tuned by controllably dividing an input current among the groups of LEDs. For lamps using LEDs whose color is stable over time, the tuning can be performed once, e.g., during manufacture and/or factory testing of the lamp, and the lamp can thereafter operate at a stable color temperature without requiring active feedback components.

For example, in some embodiments a lamp includes two distinct groups of white LEDs: one group ("warm white") that produces white light with a warmer color temperature than is desired and another group ("cool white") that produces white light with a cooler color temperature than is desired. In such lamps, the color temperature can be tuned by controllably dividing an input current between the warm white group and the cool white group. In some embodiments, an optimal division of the input current can be determined based on a linear relationship between a shift in the fraction of current provided to each group and a shift in color-space coordinates (which correspond to color temperature) that obtains over the relevant (small) region in color space; the process is simple, requiring as few as three measurements, and can be highly automated to facilitate mass production of color-tuned lamps.

In other embodiments, a lamp includes three distinct groups of LEDs, for example, warm white, cool white, and red (other non-white colors can also be used). In some embodiments, tuning between the warm white and cool white groups is performed with the red (or other non-white) LED group turned off. Tuning between the "tuned white" light and the red LED group can then be performed, relying on the fact that as long as the current split between warm white and cool white LEDs does not change, the "tuned white" color will not shift with a shift in total current supplied to the white LEDs. Alternatively, triangular interpolation can be used for tuning, relying on the fact that over a small region in color space, the amount of change in the division of current between two groups of LEDs is linearly related to the amount of change in color-space coordinates.

In still other embodiments, a lamp includes four distinct groups of LEDs, for example, warm white, cool white, red, and green (other non-white colors can also be used; for producing white light, the non-white colors are advantageously complementary). Tuning between the warm white and cool white groups is performed with the non-white LED groups turned off. Tuning between the "tuned white" light and the red and/or green LED groups can then be performed, relying on the fact that as long as the current split between warm white and cool white LEDs does not change, the "tuned white" color will not shift with a shift in total current supplied to the white LEDs. Further tuning of the color can be achieved by adding green to the tuned white/red color. Again, triangular interpolation techniques or other linear interpolation can be used over a small region in color space.

Any number of groups of LEDs can be used. LEDs in different groups advantageously occupy non-overlapping regions of color space, and the target color is intermediate between the color-space regions occupied by the different groups.

Applying processes described herein across a number of lamps allows substantial reduction in the color variation from one lamp to the next. In addition, the tuning process can be confined to a relatively small region in color space such that color shift as a function of current shift from one group of LEDs to another can be modeled as a linear relation. Using linear modeling, the appropriate adjustment for a given lamp can be determined from a small number of measurements. Thus, tuning of a lamp can be accomplished quickly, allowing the tuning process to be incorporated into a mass-production environment.

Additional embodiments of the invention relate to tuning apparatus that provide a high degree of automation for the tuning process, suitable for use in mass-production environments.

One aspect of the invention relates to apparatus for tuning a color produced by a lamp that has multiple groups of LEDs, where each group of LEDs produces light having a different color and a current applied to each group of LEDs is independently variable. The apparatus includes an adjustment fixture configured to hold the lamp, a spectrometer configured to detect and measure a color of light produced by the lamp, a current supply subsystem configured to deliver a current to each one of the groups of LEDs, with the current delivered to each one of the groups of LEDs being independently variable, and a control system coupled to the spectrometer and the current supply subsystem. (For example, the current supply subsystem can include a current source that produces a total current and a programmable potentiometer that distributes the total current among different current inputs to the lamp, with each current input being associated with a different one of the groups of LEDs.) The control system is configured to receive the measured light color from the spectrometer and to provide a current controlling signal to the current control circuit. The control system also includes a control processor configured to operate the current supply subsystem and the spectrometer to make at least two initial measurements of the color of the light, for at least two different testing distributions of a total current among the groups of LEDs, and to determine, based on the at least two initial measurements, a target distribution of the total current among the groups of LEDs, wherein the target distribution of the total current causes the lamp to produce light having a color closely approximating a target color. The control processor can instruct the current supply subsystem to provide the target distribution of the total current to the groups of LEDs.

In some embodiments, the apparatus can also include a robotic system configured to place the lamp into the adjustment fixture and to remove the lamp from the adjustment fixture, and the control system can be configured to operate the robotic system. This allows for an automated, high-throughput tuning process without manual intervention to place and remove the lamps.

In some embodiments, the lamp includes a total internal reflection lens to mix the light produced by the LEDs, and the spectrometer is configured to receive light exiting from a front face of the total internal reflection lens.

Various techniques can be used to determine the target distribution of the total current. For example, the initial measurements can include a first measurement made at a time when all of the total current is supplied to a first one of the groups of LEDs and no current is supplied to any other of the groups of LEDs and a second measurement made at a time when all of the total current is supplied to a second one of the groups of LEDs and no current is supplied to any other of the groups of LEDs. In some embodiments, a third measurement can also be made at a time when an approximately equal fraction of the total current is provided to each of the groups of LEDs. The control circuit can be configured to compute an approximation to the target distribution of the total current based on the first, second, and third measurements. In some embodiments, the approximation can be computed using linear interpolation techniques.

Another aspect of the invention relates to apparatus for tuning a color produced by a lamp having multiple independently-addressable groups of LEDs, each of which produces light having a different color, and an onboard control unit capable of providing a variable current to each of the groups of LEDs. The apparatus can include an adjustment fixture configured to hold the lamp, a spectrometer configured to detect and measure a color of light produced by the lamp, a current source configured to be connected to the lamp and to deliver a current to the onboard control unit of the lamp, and a control system configured to be coupled to the spectrometer, the current source, and the onboard control unit of the lamp. The control system is configured to receive the measured light color from the spectrometer and to provide a current controlling signal to the onboard control unit of the lamp. The control system also includes a control processor configured to operate the spectrometer, the current source, and the onboard control unit of the lamp to make at least two initial measurements of the color of the light, for at least two different testing distributions of a total current among the groups of LEDs; to determine, based on the at least two initial measurements, a target distribution of the total current among the groups of LEDs, wherein the target distribution of the total current causes the lamp to produce light having a color closely approximating a target color; and to communicate information indicative of the target distribution to the onboard control unit of the lamp. In some embodiments, the onboard control unit can store the information for use in subsequent operation of the lamp.

Various lamps can be used. In some embodiments, the independently-addressable groups of LEDs include a group of warm white LEDs associated with a first color temperature and a group of cool white LEDs associated with a second color temperature; the target color advantageously corresponds to a color temperature intermediate between the first color temperature and the second color temperature. In other embodiments, the independently-addressable groups of LEDs can include at least three groups of white LEDs, each group producing light of a different color, and the target color can correspond to a point on a blackbody curve in a color space.

Another aspect of the invention relates to apparatus for tuning a color produced by a lamp having warm white LEDs and cool white LEDs, along with an onboard control unit capable of independently providing a first current to the warm white LEDs and a second current to the cool white LEDs. The apparatus can include an adjustment fixture configured to hold the lamp, a spectrometer configured to detect and measure a color of light produced by the lamp, an external control device configured to communicate with the onboard control unit of the lamp, and a control system coupled to the spectrometer and the external control device. The control system is configured to receive the measured light color from the spectrometer and to provide a current controlling signal to the external control device. The control system can be configured to operate the external control device and the spectrometer to make at least two initial measurements of the color of the light, for at least two different testing values of the first current and the second current; to compute, based on the at least two initial measurements, a target value for each of the first current and the second current; and to instruct the external control device to set the onboard control unit to provide the target value of the first current to the warm white LEDs and to provide the target value of the second current to the cool white LEDs.

The following detailed description together with the accompanying drawings will provide a better understanding of the nature and advantages of the present invention.

DETAILED DESCRIPTION OF THE INVENTION

Embodiments of the present invention relate to techniques and apparatus for tuning the color of an LED-based lamp to a desired color temperature. Particular embodiments are adapted for use with lamps that include two or more independently addressable groups of LEDs that each produce light of a different color or color temperature. The lamps can also include a total-internal-reflection (TIR) color-mixing lens to produce light of a uniform color by mixing the light from the different groups of LEDs. The uniform color or color temperature output from the lamp is tuned by controllably dividing an input current among the groups of LEDs. For lamps using LEDs whose color is stable over time, the color tuning can be performed once, e.g., during manufacture and/or factory testing of the lamp, and the lamp can thereafter operate at a stable color temperature without requiring active feedback components.

Embodiments for tuning lamps with two independently addressable groups of LEDs will be considered first, after which extensions to lamps with larger numbers of groups. As used herein, a "group" of LEDs refers to any set of one or more LEDs that occupies a defined region in color space; the regions are defined such that regions occupied by different groups in the same lamp do not overlap. The lamp is advantageously designed such that the current supplied to each group of LEDs can be controlled independently of the current supplied to other LEDs, and the groups are thus said to be "independently addressable."

Figure 1A:
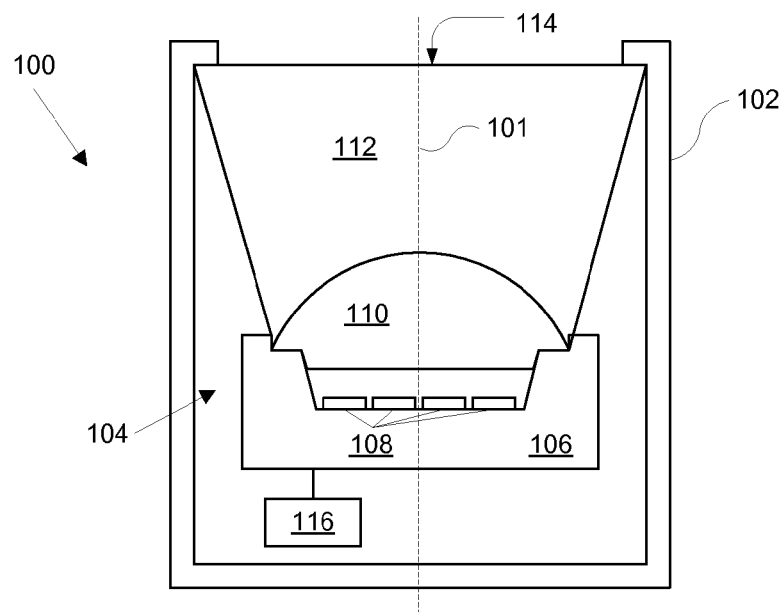
FIG. 1A is a simplified cross-sectional side view of an LED-based lamp with tunable emitters according to an embodiment of the present invention.

FIG. 1A is a simplified cross-sectional side view of an LED-based lamp 100 with tunable emitters according to an embodiment of the present invention. Lamp 100, which can be cylindrical about an axis 101 (other shapes can also be used), has a housing 102, which can be made of aluminum, other metals, plastic, and/or other suitable material. Housing 102 holds the various components of lamp 100 together and can provide a convenient structure for a user to grip lamp 100 during installation or removal from a light fixture. The exterior of housing 102 can include mechanical and/or electrical fittings (not shown) to secure lamp 100 into a light fixture and/or to provide electrical power for producing light. In some embodiments, housing 102 may include fins or other structures to facilitate dissipation of heat generated during operation of lamp 100.

Within housing 102 is an LED package 104. Package 104 includes a substrate 106 on which are mounted individual LEDs 108. Each LED 108 can be a separate semiconductor die structure fabricated to produce light of a particular color in response to electrical current. In some embodiments, each LED 108 is coated with a material containing a color-shifting phosphor so that LED 108 produces light of a desired color. For example, a blue-emitting LED die can be coated with a material containing a yellow phosphor; the emerging mixture of blue and yellow light is perceived as white light having a particular color temperature.

In some embodiments, lamp 100 also includes a control circuit 116 that controls the power provided from an external power source (not shown) to LEDs 108. As described below, control circuit 116 advantageously allows different amounts of power to be supplied to different LEDs 108.

A primary lens 110, which can be made of glass, plastic or other optically transparent material, is positioned to direct light emitted from LEDs 108 into secondary optics 112. Secondary optics 112 advantageously include a total-internal-reflection (TIR) lens that also provides mixing of the colors of light emitted from LEDs 108 such that the light beam exiting through front face 114 has a uniform color. Examples of suitable lenses are described in U.S. Patent Application Pub. No. 2010/0091491; other color-mixing lens designs may also be used. As described below, tuning is advantageously performed based on the color of light exiting through front face 114 of TIR lens 112.

Figure 1B:
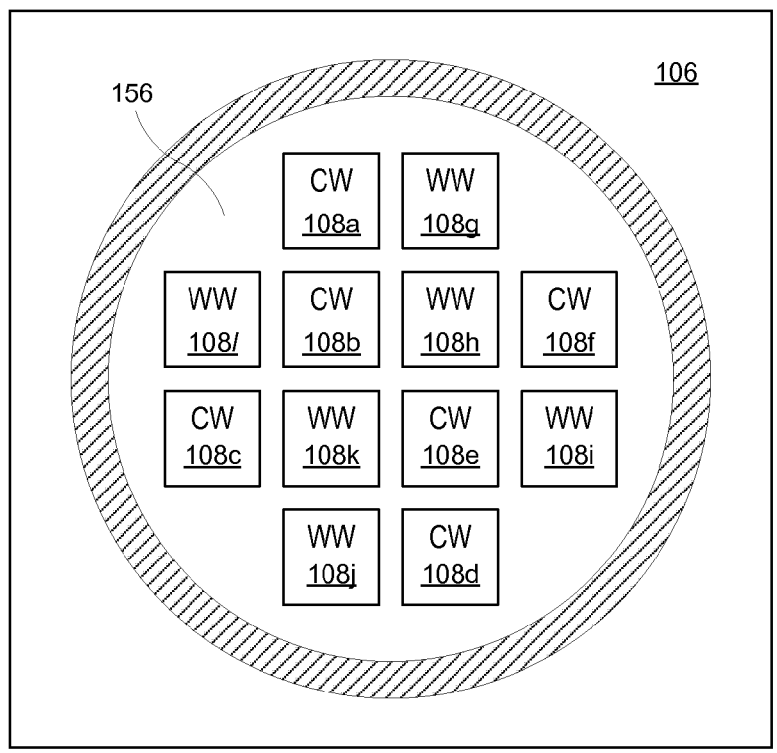
FIG. 1B is a top view of a substrate holding LEDs that may be used in the lamp of FIG. 1A.

In some embodiments LEDs 108 advantageously include both "warm" and "cool" white LEDs. An example is illustrated in FIG. 1B, which is a top view of substrate 106 according to an embodiment of the present invention. As shown, twelve LEDs 108a-l are arranged within a recess 156 on substrate 106. Six of the LEDs are cool white ("CW") LEDs 108a-f; the other six are warm white ("WW") LEDs 108g-l. "Cool" white and "warm" white, as used herein, refer to the color temperature of the light produced. Cool white, for example, can correspond to a color temperature above, e.g., about 4000 K, while warm white can correspond to a color temperature below, e.g., about 3000 K. It is desirable that cool white LEDs 108a-f have a color temperature cooler than a target color temperature for lamp 100 while warm white LEDs 108g-l have a color temperature warmer than the target color temperature. When light from cool white LEDs 108a-f and warm white LEDs 108g-l is mixed by mixing lens 112, the target temperature can be achieved. More generally, for purposes of providing a tunable lamp, the lamp can include LEDs belonging to any number of "groups," with each group being defined as producing light within a different color or color temperature range (or "bin"); the ranges associated with different groups advantageously do not overlap, and the desired color or color temperature to which the lamp will be tuned is somewhere between the colors or color temperatures associated with the groups of LEDs.

Figure 2A:
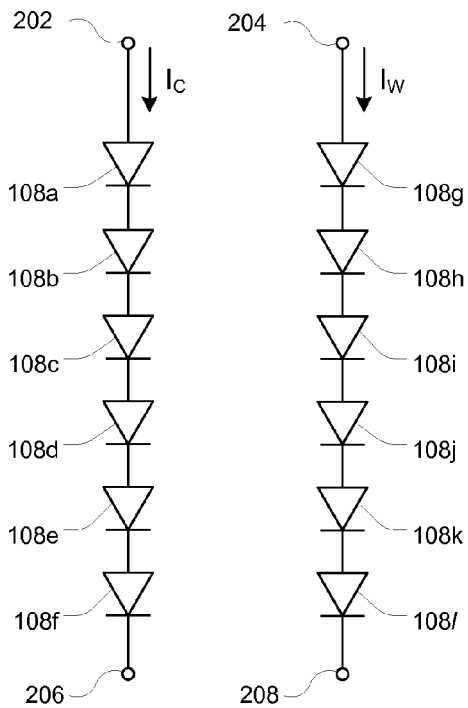
FIGS. 2A and 2B illustrate examples of electrical connectivity that can be used to provide independent addressability of warm white and cool white LEDs.
Figure 2B:
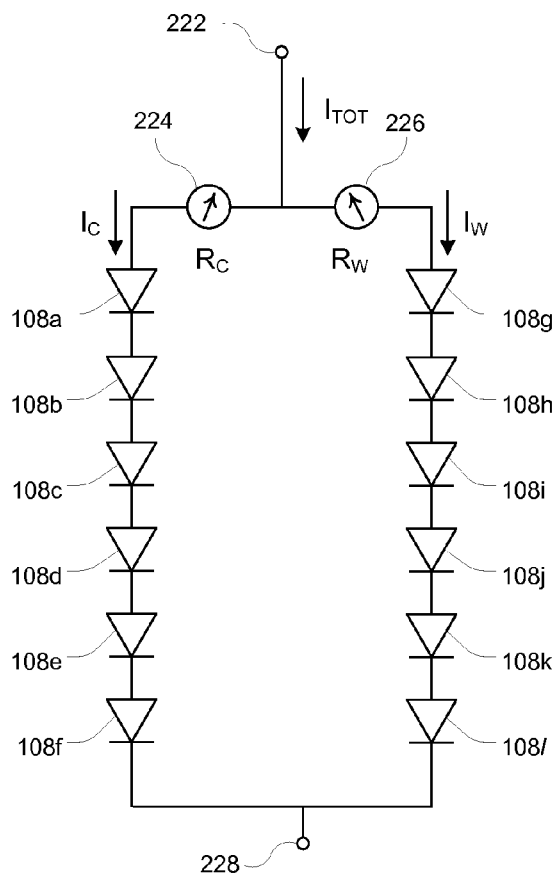

To facilitate achieving a desired color temperature, the LEDs 108 of lamp 100 are advantageously connected such that cool white LEDs 108a-f and warm white LEDs 108g-l are independently addressable, i.e., different currents can be supplied to different LEDs. FIGS. 2A and 2B are simplified schematics illustrating examples of electrical connectivity that can be used to provide independent addressability of warm white and cool white LEDs. These electrical connections can be implemented, e.g., using traces disposed on the surface of substrate 106 and/or between electrically insulating layers of substrate 106. Examples of substrates that provide independent addressability for groups of LEDs are described in U.S. Patent App. Pub. No. 2010/0259930; other substrates can also be used.

In FIG. 2A, cool white LEDs 108a-f are connected in series between a first input node 202 and a first output node 204; warm white LEDs 108g-l are connected in series between a second input node 206 and a second output node 204. Consequently, one current ($I_C$) can be delivered to cool white LEDs 108a-f while a different current ($I_W$) is delivered to warm white LEDs 108g-l. The currents $I_C$ and $I_W$ can be independently controlled, thereby allowing the relative brightness of cool white LEDs 108a-f and warm white LEDs 108g-l to be controlled; this provides control over the color temperature of light produced by lamp 100. For example, control circuit 116 (FIG. 1A) can be connected to nodes 202 and 206 and to nodes 204 and 208 to deliver the desired currents $I_C$ and $I_W$.

FIG. 2B illustrates one specific technique for implementing per-group current control. As in FIG. 2A, cool white LEDs 108a-f are connected in series, and warm white LEDs 108g-l are also connected in series. In FIG. 2B, the last LEDs in each series (LEDs 108f and 108l) are connected to a common output node 228. A common input node 222 receives a total current $I_{TOT}$, which is divided between cool white LEDs 108a-f and warm white LEDs 108g-l using potentiometers (or variable resistors) 224, 226. Potentiometer 224 can be set to a resistance $R_C$ while potentiometer 226 can be independently set to a resistance $R_W$; as a result, a current $I_C$ is delivered to cool white LEDs 108a-g while a current $I_W$ is delivered to warm white LEDs 108g-l. By controlling $R_W$ and $R_C$, $I_{TOT}$ can be divided between $I_W$ and $I_C$ in a controllable proportion according to the property that $I_W/I_C=R_C/R_W$. Thus, as in FIG. 2A, the relative brightness of cool white LEDs 108a-f and warm white LEDs 108g-l can be controlled, thereby providing control over the color temperature of light produced by lamp 100. In one embodiment, control circuit 116 can be connected to nodes 222 and 228 to supply current $I_{TOT}$, and further connected to control resistances $R_C$ and $R_W$.

Other addressing schemes can also be used; for example, each of the LEDS 108a-l can be independently addressable.

It will be appreciated that lamp 100 described herein is illustrative and that variations and modifications are possible. In one embodiment, lamp 100 can be similar to a LuxSpot™ lamp, manufactured and sold by LedEngin Inc., assignee of the present invention. Those skilled in the art with access to the present teachings will recognize that any lamp that has independently addressable warm white and cool white LEDs can also be used; thus, details of the lamp are not critical to understanding the present invention.

In accordance with some embodiments of the present invention, the currents $I_C$ and $I_W$ (shown in FIGS. 2A and 2B) can be efficiently tuned so that the light output from lamp 100 has a desired color temperature. The tuning process advantageously requires only a small number (e.g., three or four) of measurements and does not rely on trial-and-error. The process can also be automated to allow tuning of a large number of lamps in a mass-production environment; thus, color tuning can be incorporated into lamp production, e.g., as a stage in an assembly line.

Further, it should be noted that in the embodiment shown, lamp 100 does not include any active feedback components. As described below, lamp 100 can be placed into a tuning apparatus and color-tuned during production. Thereafter, lamp 100 can be configured to operate at the desired color temperature simply by maintaining the division (or distribution) of current determined in the tuning process. Provided that the LEDs in lamp 100 can maintain a stable color temperature over time, no further tuning or active feedback is needed during normal lamp operation. Since active feedback is not needed, the cost of manufacture can be reduced as compared to lamps that require active feedback to maintain a stable color temperature.

Figure 3:
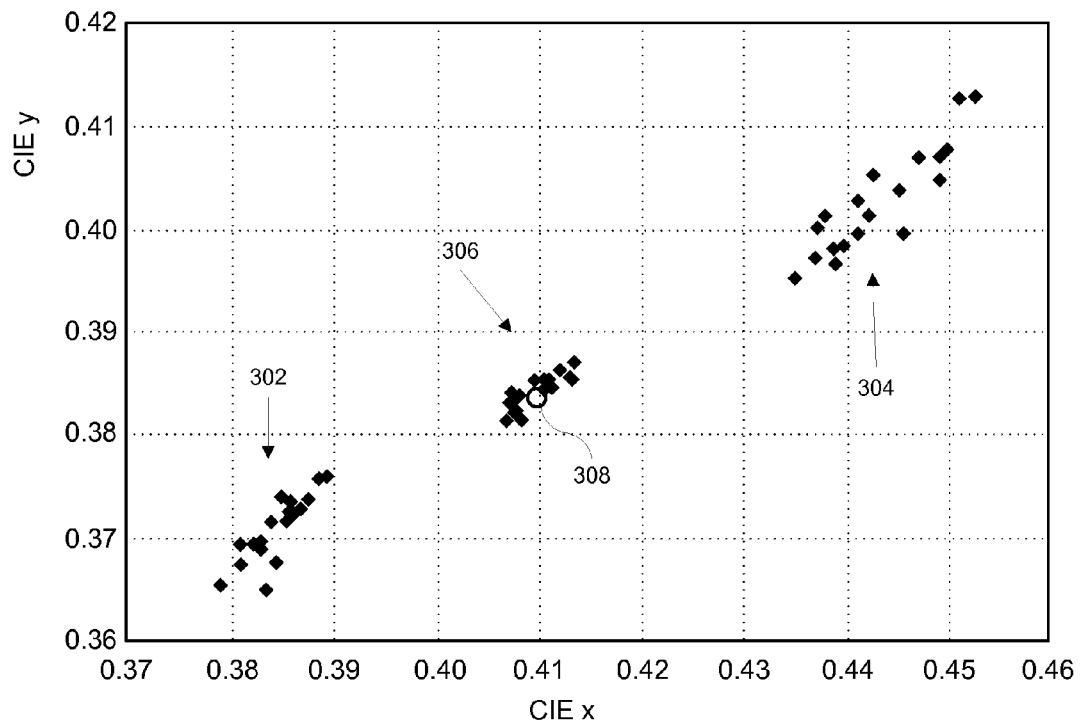
FIG. 3 is a plot illustrating operating characteristics of lamps usable in some embodiments of the present invention.

To understand the tuning process, it is useful to begin by considering the behavior of untuned lamps. FIG. 3 is a plot illustrating operating characteristics of lamps usable in some embodiments of the present invention. The graph 300 represents a portion of CIE color space, which characterizes light in terms of luminance (CIE y) and chromaticity (CIE x) coordinates. The portion of the CIE color space represented encompasses much of the range associated with white light. The various data points (black diamonds) represent colors measured from a number of LED-based lamps having independently addressable warm white and cool white LED groups, e.g., as described above with reference to lamp 100, under various operating conditions.

More specifically, for purposes of these measurements, a total current $I_{TOT}$ of 1000 mA was supplied to the lamp, and the constraint $I_C+I_W=I_{TOT}$ was maintained. "Cool white" data, represented by points 302, was measured for each lamp by setting $I_C=I_{TOT}$ and $I_W=0$. "Warm white" data, represented by points 304, was measured for each lamp by setting $I_C=0$ and $I_W=I_{TOT}$. "Balanced" data, represented by points 306, was measured by setting $I_C=I_W=0.5*I_{TOT}$.

A target color is represented by circle 308, and the goal is to produce colors as close to this target as possible. As can be seen, merely applying equal current to the warm white and cool white LEDs results in balanced data points 306 being scattered about target 308. While the balanced colors are more consistent across different lamps than can readily be obtained by using LEDs of a single white color, further improvement in color consistency can be achieved by tuning the relative currents $I_C$ and $I_W$ (and consequently the color) on a per-lamp basis. Such tuning in a typical case results in unequal currents being supplied to the warm white and cool white LEDs, with the currents being selected to reduce the lamp-to-lamp variation by bringing the light from each lamp closer to target 308.

Figure 4:
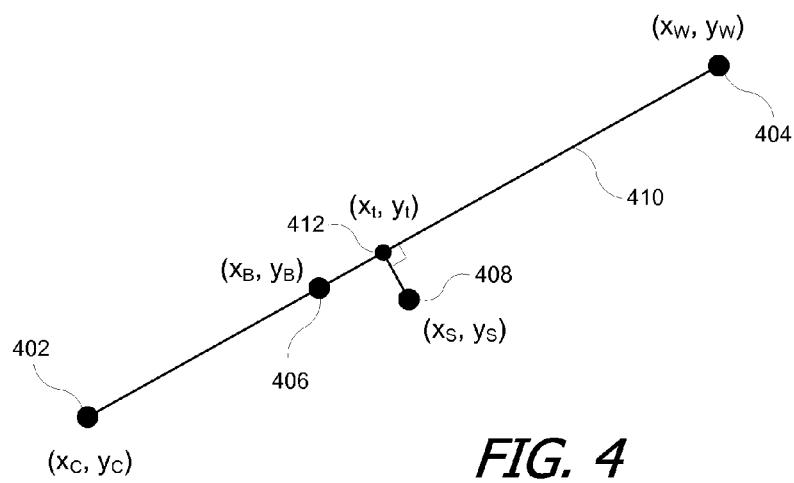
FIG. 4 illustrates an operating principle for tuning a lamp according to an embodiment of the present invention.

FIG. 4 illustrates an operating principle for tuning a lamp according to an embodiment of the present invention. Point 402, at coordinates $(x_C, y_C)$ in CIE color space, represents the location of a "cool white" data point for a particular lamp (e.g., one of data points 302 in FIG. 3). Similarly, point 404, at coordinates $(x_W, y_W)$ in CIE color space, represents the location of a "warm white" data point for the same lamp (e.g., one of data points 304 in FIG. 3). Point 406, at coordinates $(x_B, y_B)$ represents the balanced data for that lamp (e.g., one of data points 306). Point 408, at coordinates $(x_s, y_s)$, represents a single-color point to which it is desirable to tune the lamp. (This point, which can correspond to target 308 in FIG. 3, may be specified by the manufacturer of the lamp or any other entity who may be performing the tuning process.)

Blending light of the colors corresponding to points 402 and 404 results in a color somewhere along line 410. Thus, it may not be possible to produce blended light with a color corresponding exactly to single-color point 408. Accordingly, the aim instead is to reach the closest point to point 408 that is on line 410, i.e., "tuned" point 412 at coordinates $(x_t, y_t)$. In a typical case $(x_t, y_t)$ and $(x_B, y_B)$ are not the same, and $(x_t, y_t)$ may be different for different lamps; thus, tuning on a per-lamp basis is desired.

In general, the relationship between a change in the relative currents (measured, e.g., as $I_W/I_C$) supplied to the warm and cool LEDs and the resulting shift in color temperature is nonlinear. Further, the magnitude of the shift in color temperature resulting from a given change in relative current varies from one lamp to another.

Figure 5:
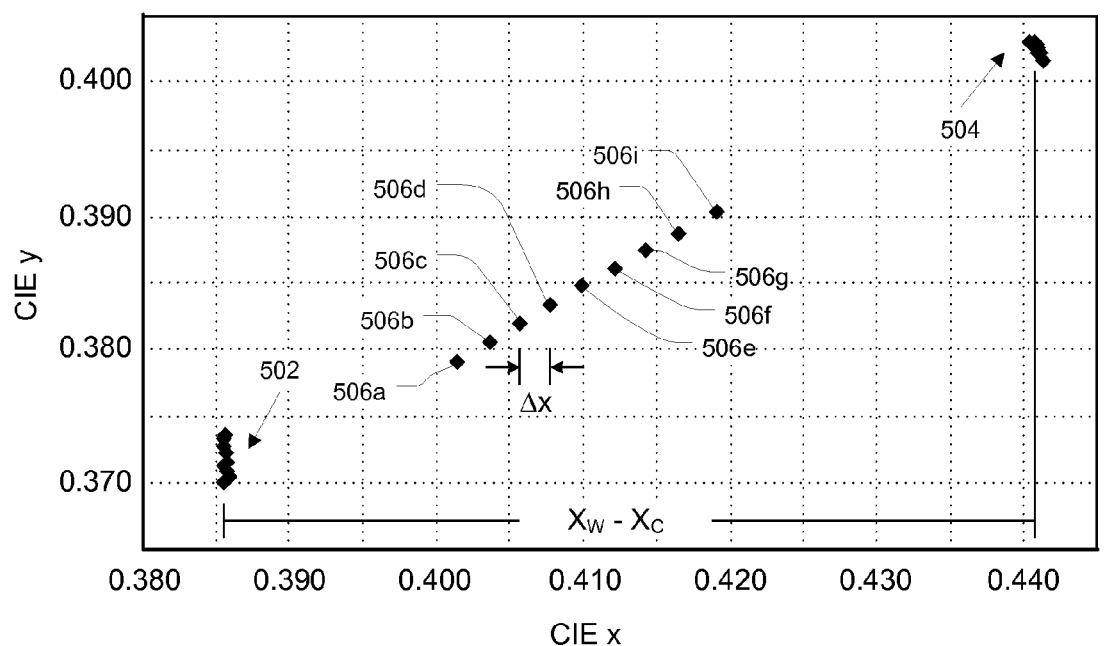
FIG. 5 is a plot showing the effect on color temperature of a series of shifts in current for a number of lamps.

However, as illustrated in FIG. 5, over a sufficiently narrow range of color space, the relationship can be approximated as linear. FIG. 5 is a plot showing the effect on color temperature of a series of 50-mA shifts in current for a number of lamps. Data points 502 represent the cool white color (i.e., color when $I_C=I_{TOT}$; $I_W=0$) for a number of lamps of similar manufacture; and data points 504 represent the warm white color (i.e., color when $I_C=0$; $I_W=I_{TOT}$) for the same lamps. Data points 506a-i represent successive measurements at different relative currents. Specifically, each data point 506a-i represents a shift in current of $\Delta I=50$ mA from $I_C$ to $I_W$. For example, if point 506c corresponds to ($I_C=I_W=0.5*I_{TOT}$), then point 506b would correspond to ($I_C=0.5*I_{TOT}+\Delta I$; $I_W=0.5*I_{TOT}-\Delta I$). Similarly, point 506d would correspond to ($I_C=0.5*I_{TOT}-\Delta I$; $I_W=0.5*I_{TOT}+\Delta I$), point 506e to ($I_C=0.5*I_{TOT}-2*\Delta I$; $I_W=0.5*I_{TOT}+2*\Delta I$), and so on.

As FIG. 5 indicates, the shift in CIE x coordinate ($\Delta x$) resulting from a specific shift $\Delta I$ in relative current between cold and warm LEDs (with total current held constant) is approximately constant for a given lamp, at least over some range of CIE space. Although not explicitly shown, the magnitude of the constant CIE shift $\Delta x$ is not constant from one lamp to another. However, for lamps in which the LEDs have a constant flux density, it has been found that the parameter $$\alpha = \left(\frac{1}{x_W - x_C}\right)\left(\frac{\Delta x}{\Delta I}\right) \quad \text{(Eq. 1)}$$

is very nearly constant for different lamps. In one embodiment, $\alpha$ is about 0.0008052 mA$^{-1}$. In other embodiments, the applicable ratio $\alpha$ can be determined by measuring a sampling of lamps.

Accordingly, referring to FIG. 4, given $(x_C, y_C)$ and $(x_W, y_W)$ for a particular lamp, and a desired color $(x_s, y_s)$, a tuned point $(x_t, y_t)$ on line 410 can be computed. If $(x_B, y_B)$ is also measured, then the desired shift in CIE x coordinate that will tune the lamp is $(x_t-x_B)$. The size of the current shift needed to produce this coordinate shift can be computed using:

$$I_\delta = \left(\frac{1}{\alpha}\right) * \left(\frac{x_t - x_B}{x_W - x_C}\right). \quad \text{(Eq. 2)}$$

where $\alpha$ is the constant ratio defined in Eq. 1. Setting $$I_{C0} = 0.5*(I_{TOT}+I_\delta) \quad \text{(Eq. 3)}$$

and $$I_{W0} = 0.5*(I_{TOT}-I_\delta) \quad \text{(Eq. 4)}$$

can be expected to produce light of color $(x_t, y_t)$.

Figure 6:
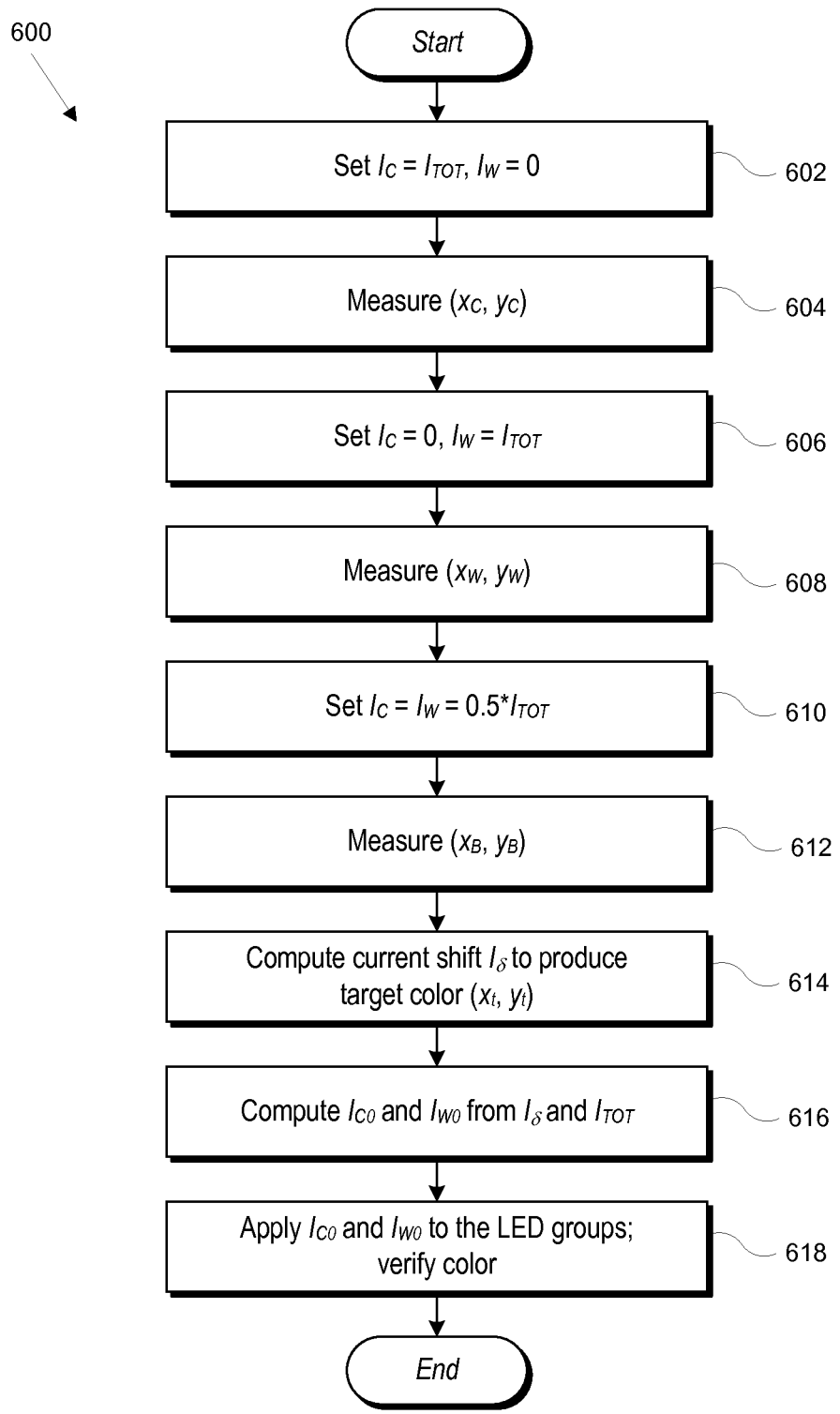
FIG. 6 is a flow diagram of a tuning process according to an embodiment of the present invention.

Based on the foregoing, a rapid tuning procedure can be applied to tune an LED lamp. FIG. 6 is a flow diagram of a tuning process 600 according to an embodiment of the present invention. Process 600 can be applied to any lamp that incorporates independently addressable warm white and cool white LEDs and can be used to determine how to divide a fixed total current $I_{TOT}$ between the warm white and cool white LEDs to best match a desired color $(x_s, y_s)$. Process 600 assumes that this desired color has been specified and that the constant ratio $\alpha$ defined above has been determined.

At block 602, the input current to the LED lamp (or settings on potentiometers within the lamp) is adjusted such that $I_C=I_{TOT}$ and $I_W=0$. At block 604, the color of the resulting light is measured, e.g., as $(x_C, y_C)$. Conventional spectrometers or other known instruments can be used for this measurement and all color measurements described herein.

At block 606, the input current to the LED lamp (or settings on potentiometers within the lamp) is adjusted such that $I_W=I_{TOT}$ and $I_C=0$. At block 608, the color of the resulting light is measured, e.g., as $(x_W, y_W)$.

At block 610, the input current to the LED lamp (or settings on potentiometers within the lamp) is adjusted such that $I_C=I_W=0.5*I_{TOT}$. At block 612, the color of the resulting light can be measured, e.g., as $(X_B, y_B)$.

At block 614, a current shift $I_\delta$ that will produce a tuned color $(x_t, y_t)$ is computed using the linear relation observed above. More specifically, $(x_t, y_t)$ can be computed as the nearest point to $(x_s, y_s)$ that is on the line between measured $(x_C, y_C)$ and $(x_W, y_W)$ (see FIG. 4) using:

$$x_t = x_C + u(x_W - x_C) \quad \text{(Eq. 5)}$$
$$y_t = y_C + u(y_W - y_C),$$

where $$u = \frac{(x_s - x_C)(x_W - x_C) + (y_s - y_C)(y_W - y_C)}{\sqrt{(x_W - x_C)^2 + (y_W - y_C)^2}}. \quad \text{(Eq. 6)}$$

Then, $I_\delta$ can be computed using Eq. 2.

At block 616, the operating currents $I_{C0}$ and $I_{W0}$ can be determined using Eqs. 3 and 4.

At block 618, to confirm the computation, operating currents $I_{C0}$ and $I_{W0}$ can be applied to the lamp. The resulting color can be measured and compared to the predicted $(x_t, y_t)$.

It will be appreciated that process 600 is illustrative and that variations and modifications are possible. Steps described as sequential may be executed in parallel, order of steps may be varied, and steps may be modified, combined, added or omitted. In addition, while the embodiment described takes the measurements used to calculate $I_\delta$ at the "extreme" points and the "mid" point of possible current splits, those skilled in the art will appreciate that other points could also be used. For example, if desired, measurements could be taken at 10/90 and 90/10 current splits, and at the midpoint some other intermediate point. As long as three distinct measurements at three distinct current splits are made, the process above can be used to determine a current split to achieve a desired tuned color temperature (or color). In some embodiments, the target value is advantageously close to the midpoint between the warm and cool color temperatures, as this allows the lamp to operate at highest efficiency (i.e., maximum lumens per LED die). This can be reliably achieved by selecting the warm white and cool white LEDs such that the target value is near the midpoint; in one embodiment, the warm white and cool white LEDs are selected such that the tuned color will always be reached with a warm/cool current split somewhere in the range between 30/70 and 70/30. However, no particular target value is required; tuning can be achieved at any point that lies between the two groups in color temperature space.

In some embodiments, process 600 can also include further fine-tuning of the color. For example, a least-squares fit can be used to determine the distance between the target point on the blackbody curve and the line between measured $x_C$ and $x_W$, and this can be used to modify the current split to fine-tune the color.

Figure 7A:
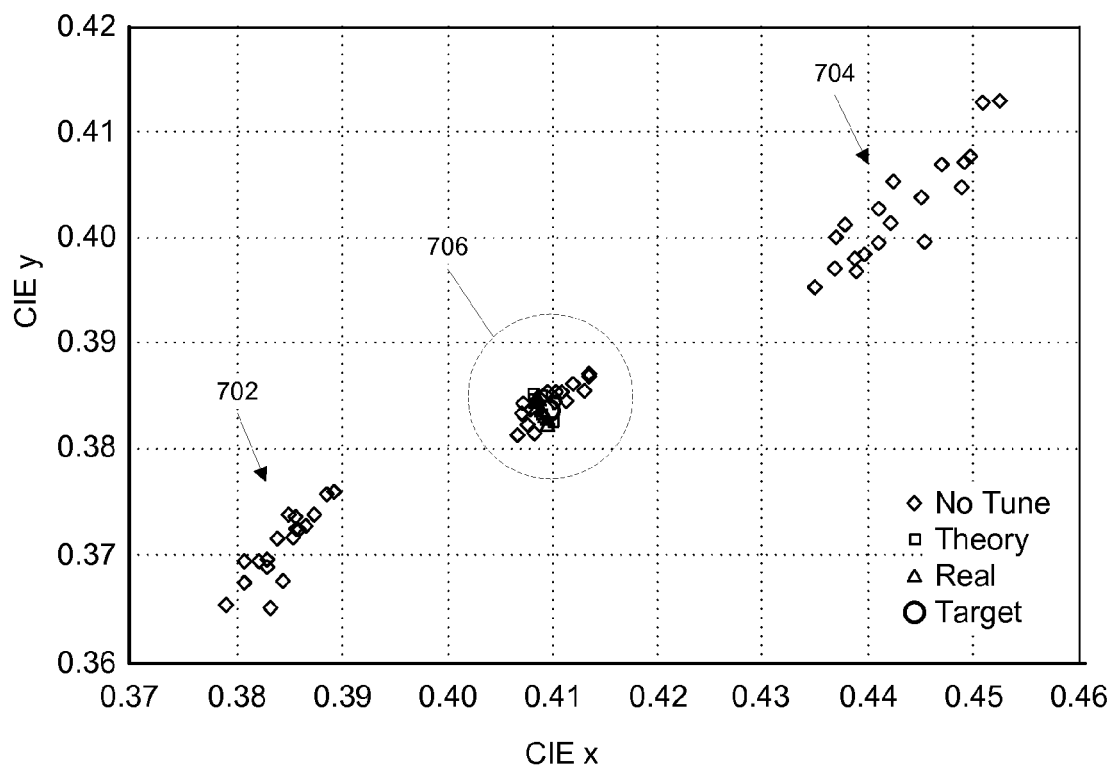
FIGS. 7A and 7B illustrate a comparison of predicted and actual behavior of a group of LED-based lamps that were tuned in accordance with the process of FIG. 6.
Figure 7B:
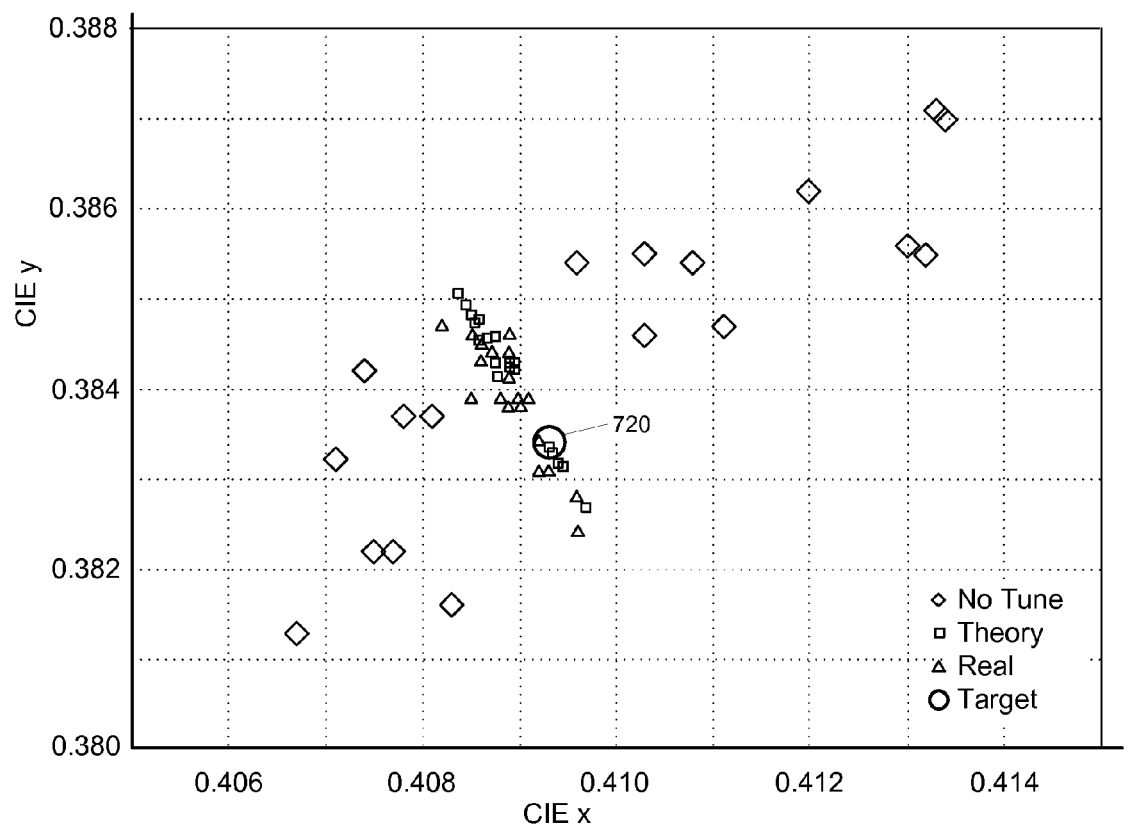

FIGS. 7A and 7B illustrate a comparison of predicted and actual behavior of a group of LED-based lamps that were tuned in accordance with process 600. FIG. 7A shows cool-white data points 702, warm white data points 704, and blended and tuned data points in area 706, which is shown in an enlarged version in FIG. 7B.

In FIG. 7B, the "no tune" data points (diamonds) correspond to the color $(x_B, y_B)$ obtained by applying equal current to the warm-white and cool-white LEDs. As can be seen, the no-tune data points are scattered about the target point 720 (corresponding to $(x_s, y_s)$). "Theory" data points (squares) indicate the predicted color $(x_t, y_t)$ for each lamp when operating using currents $I_{C0}$ and $I_{W0}$ as determined in accordance with process 600. "Real" data points (triangles) indicate the measured color $(x_0, y_0)$ when operating using $I_{C0}$ and $I_{W0}$. As shown, the agreement of the data with theory is quite good, and a substantial improvement over the "no-tune" case (i.e., simply applying equal current to both LED groups) is observed.

It is noted that, based on the degree of scatter, the improvement is greater in the CIE-x coordinate than in CIE-y. Since the human eye is less sensitive to change in CIE-y, tuning based on CIE-x (e.g., using process 600) is found to yield satisfactory results.

Figure 8:
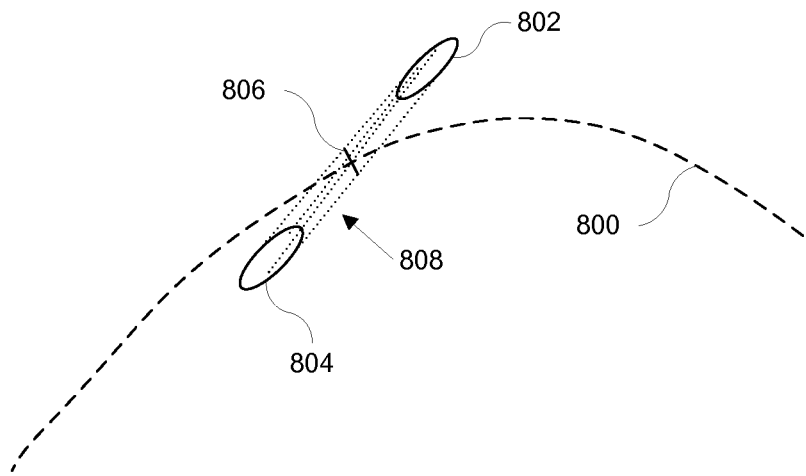
FIG. 8 illustrates an operating principle relating to selection of LEDs to achieve a desired tuned color temperature according to an embodiment of the present invention.

Tuning as described herein can be practiced with any lamp with an emitter having independently addressable groups of warm white and cool white LEDs. In some embodiments, selection of the LEDs for the warm white and cool white groups can optimize tunability. For example, FIG. 8 illustrates an operating principle relating to selection of LEDs to achieve a desired tuned color temperature according to an embodiment of the present invention. Represented in FIG. 8 is the blackbody curve 800 in CIE color space. For existing white LED manufacturing processes, the color temperature of individual LEDs cannot be precisely controlled; however, it is possible to control the color temperature to within an elliptical region in CIE color space, producing LEDs within a generally elliptical "bin." FIG. 8 illustrates two different bins: bin 802, which produces warm white light, and bin 804, which produces cool white light. Bins 802 and 804 can be large enough in color space that that differences in color between different LEDs in the same bin are perceptible to the human eye. In some embodiments, for optimal tuning to a target color temperature chosen in advance, the manufacturer can select the warm white and cool white bins such that the major axes of the ellipses representing the bins are approximately aligned in color space, as is the case for bins 802 and 804.

Using the processes described above, a lamp whose emitter contains warm white LEDs from bin 802 and cool white LEDs from bin 804 can be tuned, e.g., to a point along line 806. The exact point will in general depend on the variations in particular LEDs in a given lamp; dotted lines 808 indicate some of the possibilities. As indicated, even with a relatively large manufacturing tolerance for the LEDs, a small tuned projection (line 806) can be achieved.

In other embodiments, rather than selectively choosing LEDs to produce a given color temperature, the manufacturer can produce an emitter with one group of LEDs above the blackbody curve and another group of LEDs below the blackbody curve without targeting a particular color temperature. The lamp can be tuned to a point on the blackbody curve using techniques described above, and thereafter the lamps can be binned according to their tuned color temperature.

Figure 9:
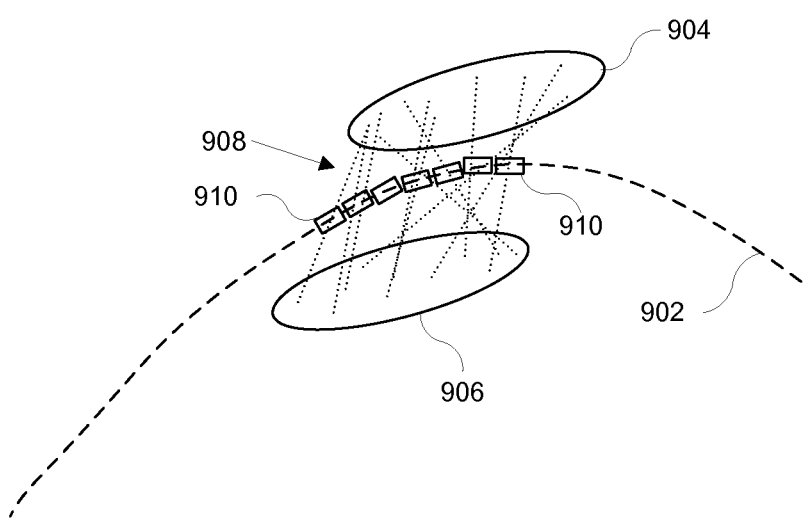
FIG. 9 illustrates an operating principle for binning of lamps based on tuned color temperature according to an embodiment of the present invention.

FIG. 9 illustrates an operating principle for binning of lamps based on tuned color temperature according to an embodiment of the present invention. Represented therein is the blackbody curve 902 in CIE color space. The two groups of LEDs are represented by ellipse 904 located above the blackbody curve and ellipse 906 located below the blackbody curve. Each lamp can be tuned to a point on blackbody curve 902, as can be inferred from the fact that any line joining a point in ellipse 904 and a point in ellipse 906 must cross curve 902. Some specific examples are indicated by dotted lines 908.

For purposes of providing lamps with a desired color, blackbody curve 902 can be segmented into a number of bins as indicated by boxes 910. The size of the bins can be chosen such that variations in color are imperceptible or nearly so. Each lamp can be assigned to a bin based on the point on blackbody curve 902 to which it tunes.

In some embodiments, further improvements in tuning can be provided by using lamps that include more than two independently addressable groups of LEDs of different colors. For example, in addition to cool white and warm white, it is possible to include red and/or green LEDs in an emitter.

Figure 10:
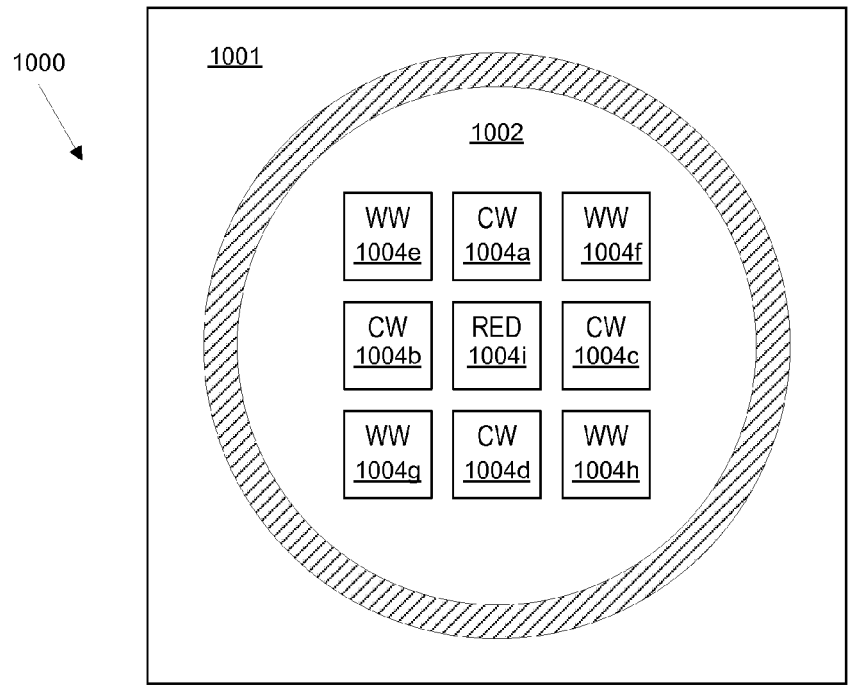
FIG. 10 is a top view of an LED emitter package with three groups of LEDs according to an embodiment of the present invention.

By way of illustration of a three-group embodiment, FIG. 10 is a top view of an LED emitter package 1000, in which a substrate 1001 has a recess 1002. Within recess 1002 are mounted four cool white (CW) LEDs 1004a-d, four warm white (WW) LEDs 1004e-h, and one red LED 1004i, arranged as shown. In this example, the red LED group contains a single LED. Those skilled in the art will appreciate that the number of LEDs in each group and/or the arrangement of LEDs can be modified as desired. Emitter package 1000 can be included in a lamp similar to lamp 100 of FIG. 1, with primary and secondary optics to provide color mixing. In this example, the control circuitry and electrical couplings are such that the cool-white group, warm-white group, and red group are each independently addressable, and the color of light emitted from the lamp can be tuned by adjusting the relative current delivered to each group.

Figure 11:
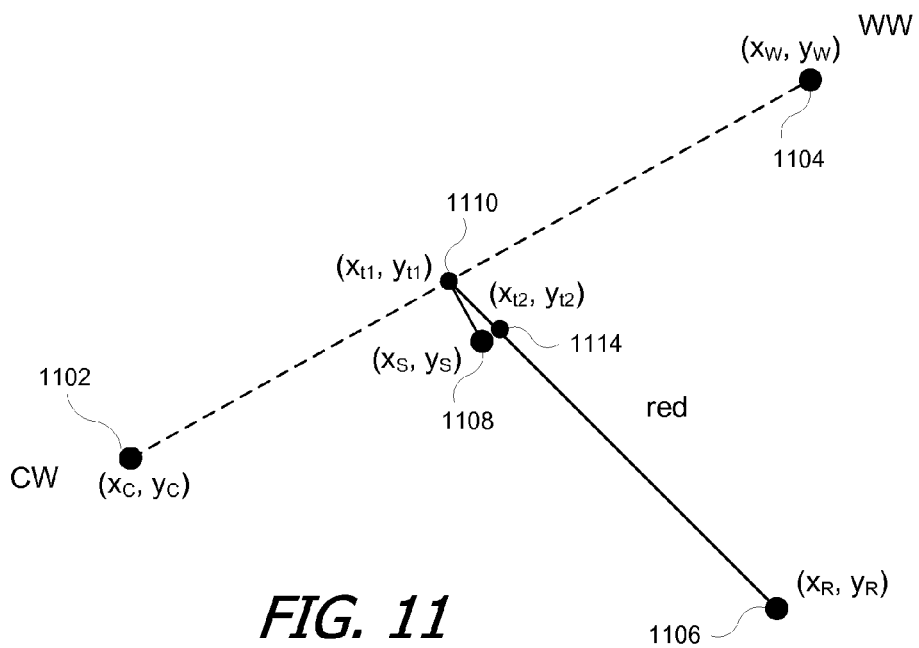
FIG. 11 illustrates an operating principle for tuning a lamp that includes an emitter package with three groups of LEDs according to an embodiment of the present invention.

FIG. 11 illustrates an operating principle for tuning a lamp that includes an emitter package with three groups of LEDs, such as emitter package 1000 of FIG. 10, according to an embodiment of the present invention. Point 1102, at coordinates $(x_C, y_C)$ in CIE color space, represents the location of a "cool white" data point for a particular lamp. Similarly, point 1104, at coordinates $(x_W, y_W)$ in CIE color space, represents the location of a "warm white" data point for the same lamp. Point 1106, at coordinates $(x_R, y_R)$ in CIE color space, represents the color of the red LED group for the same lamp. Point 1108, at coordinates $(x_s, y_s)$, represents a target point to which it is desirable to tune the lamp. (The target point may be specified by the manufacturer of the lamp or any other entity who may be performing the tuning process.)

Point 1110, at coordinates $(x_{t1}, y_{t1})$, represents a tuned color for the warm white and cool white LED groups. By performing process 600 described above (or a similar process), with no current supplied to the red LED group, a suitable division of current between the warm white and cool white groups (operating currents $I_{W0}$ and $I_{C0}$) can be determined, such that light of color $(x_{t1}, y_{t1})$ is produced. Thereafter, current distribution between the white LEDs and the red LED can be tuned to bring the color closer to $(x_s, y_s)$, while maintaining the relative currents between the warm white and cool white LEDs. Specifically, a constant current $I_{TOT}$ can be divided as follows:

$$I_{TOT} = I_R + \beta(I_{W0} + I_{C0}), \quad \text{(Eq. 7)}$$

for $0 \leq \beta \leq 1$. That is, during this phase of tuning, the currents supplied to the warm white and cool white LED groups are held in a fixed relation to each other (i.e., $I_{W0}/I_{C0}$ is constant) so that the effective color temperature ("net white") of the warm white and cool white groups is constant, and the total current to the white LED groups (i.e., $\beta(I_{W0}+I_{C0})$) is adjusted relative to the current $I_R$ to the red LED group, keeping $I_{TOT}$ constant. A process similar to process 600 can be used to determine values for $I_R$ and $\beta$ such that the resulting color is at the closest point along line 1112 to point $(x_s, y_s)$, i.e., point 1114, which has coordinates $(x_{t2}, y_{t2})$. For tuning between the net white color and the red color, a different constant $\alpha'$ would be used.

Figure 12:
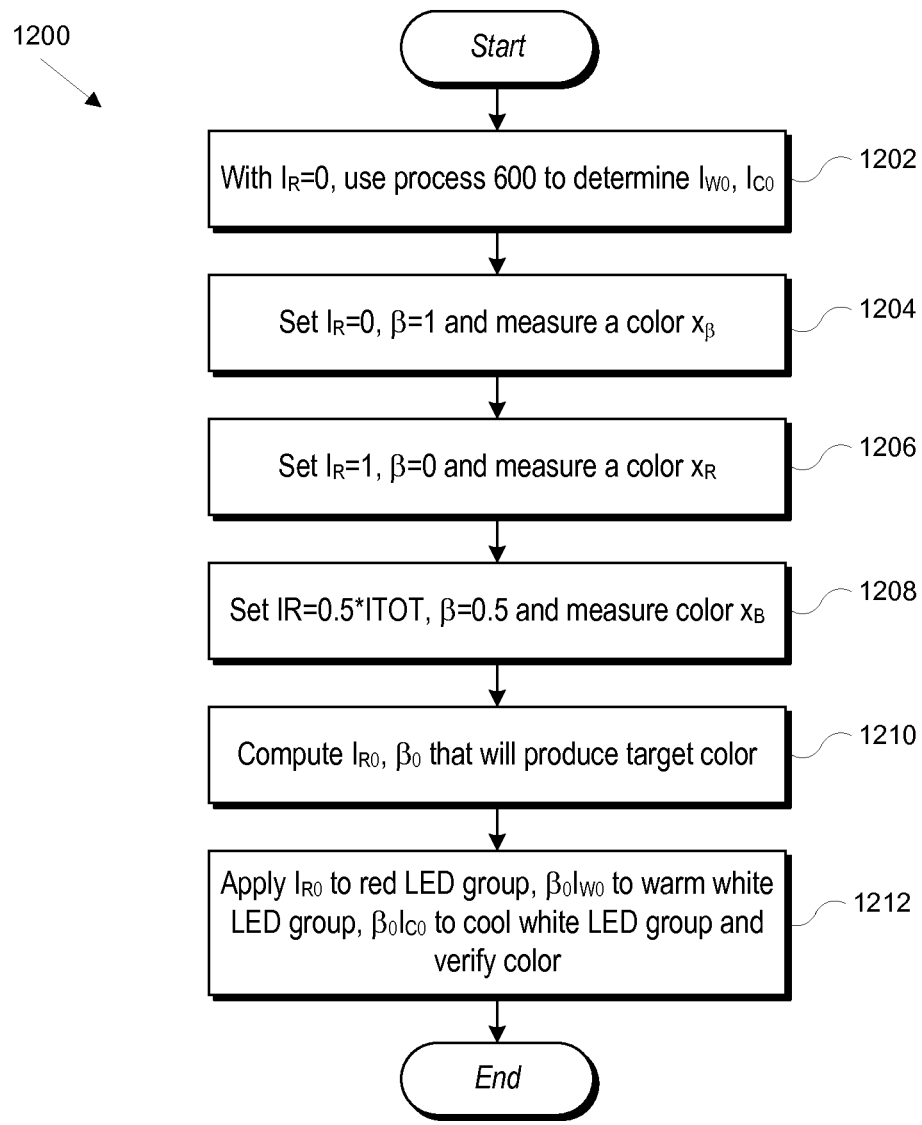
FIG. 12 illustrates a tuning process for a lamp with three groups of LEDs according to an embodiment of the present invention.

FIG. 12 illustrates a tuning process 1200 that can be used to determine $I_{W0}$, $I_{C0}$, $\beta$ and $I_R$ such that the resulting light has color-space coordinates $(x_{t2}, y_{t2})$ according to an embodiment of the present invention. First, at block 1202, with $I_R$ held constant at zero, process 600 (FIG. 6) can be used to determine $I_{W0}$ and $I_{C0}$, i.e., the division of current between the warm white and cool white LED groups that produces a net white color $(x_{t1}, y_{t1})$.

Next, tuning can be performed between the net white color and the red LED group. More specifically, at block 1204, $I_R$ in Eq. 7 is set to zero, $\beta$ is set to 1, and a color $(x_\beta, y_\beta)$ is measured. (This may be the same color as $(x_{t1}, y_{t1})$ in FIG. 11.) At block 1206, $I_R$ in Eq. 7 is set to $I_{TOT}$, $\beta$ is set to 0, and a color $(x_R, y_R)$ is measured. At block 1208, $I_R$ in Eq. 7 is set to $0.5 * I_{TOT}$, $\beta$ is set to 0.5, and a color $(x_{B2}, y_{B2})$ is measured. At block 1210, using similar linear interpolation to that described above, with an appropriate value of $\alpha$, values $I_{RO}$ and $\beta_0$ can be computed to produce the desired color $(x_{t2}, y_{t2})$. At block 1212, a current $I_{RO}$ is supplied to the red LED group, current $\beta_0 * I_{W0}$ is supplied to the warm white LED group, and current $\beta_0 * I_{C0}$ is supplied to the cool white LED group; the resulting color temperature is measured to verify the color. As in process 600, additional fine-tuning, e.g., with a least-squares fit, can be applied.

As with process 600, it is not necessary to use the "endpoint" cases at blocks 1204 and 1206. In a typical embodiment, the target color $(x_s, y_s)$ lies on the well-known blackbody curve in color space, line 1116 between points $(x_C, y_C)$, $(x_W, y_W)$ is close to the blackbody curve, and red color point $(x_R, y_R)$ is far from the blackbody curve. In such cases, $(x_{t1}, y_{t1})$ is already quite close to $(x_s, y_s)$, and a small contribution from the red LED is used to fine-tune the color. Thus, a better linear interpolation may be obtained by using an intermediate value in place of the $I_R=1$ endpoint at block 1206. For example, it may be sufficient to use $(I_R=0.3 * I_{TOT}, \beta=0.7)$.

Process 1200 is particularly effective in embodiments where the red LED color is situated in color space such that moving the color along line 1112 in FIG. 11 does not pull the color in the x direction significantly away from $x_s$; this is because the human eye is more sensitive to changes in the x direction in color space. For cases where $(x_s, y_s)$ is along the blackbody curve and $(x_R, y_R)$ is far off that curve, only a small amount of red light would be added and this will generally be the case. An alternative process can rely on triangular interpolation between three points corresponding to three different current distributions. For example, one could use the three points $(x_C, y_C)$, $(x_W, y_W)$ and $(x_R, y_R)$. Alternatively, one could use the points $(x_C, y_C)$, $(x_W, y_W)$ and a third point $(x_{R'}, y_{R'})$ that can be defined, e.g., as the color obtained using Eq. 7 with $(I_R=0.3 * I_{TOT}, \beta=0.7)$ or some other well-defined combination of currents. Here, one can first determine $I_{W0}$ and $I_{C0}$ using process 600, then measure $(X_{R'}, y_{R'})$, then interpolate. In yet another variation, triangular interpolation could be performed using as the three vertices the points $(x_{t1}, y_{t1})$ (obtained with $I_W=I_{W0}$, $I_C=I_{C0}$, IR=0), $(x_B, y_B)$ (obtained with $I_W=I_C=0.5 * I_{TOT}$, IR=0), and $(x_{R'}, y_{R'})$ (obtained with $I_W=0.7 * I_{W0}$, $I_C=0.7 * I_{C0}$, IR=$0.3 * I_{TOT}$, or some other combination of currents). In general, the closer the three vertex points are to each other in color space, the more reliable the triangular interpolation.

As FIG. 11 suggests, adding red light can help tune the color in cases where the net white color is "above" the blackbody curve in color space and the target color $(x_s, y_s)$ is on the blackbody curve. Those skilled in the art will appreciate that a green LED group could be substituted for the red LED group in cases where the net white color tends to be "below" the blackbody curve; adding green light (which lies opposite red light in CIE color space) would then allow the color to be shifted closer to the blackbody curve.

Figure 13:
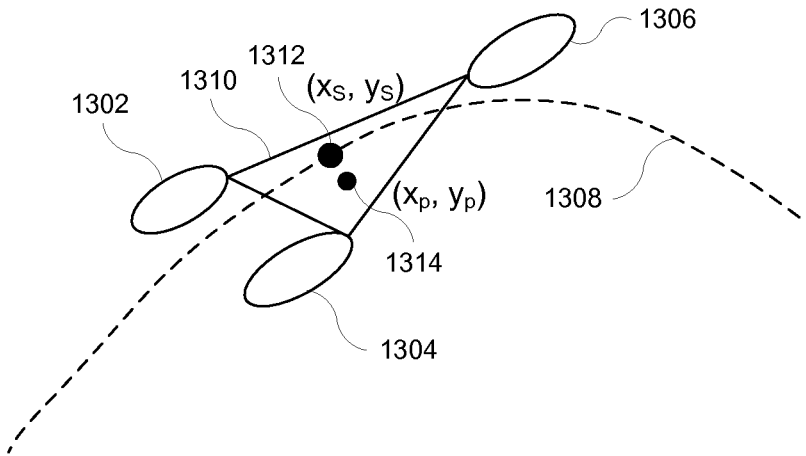
FIG. 13 illustrates an operating principle for tuning a lamp that includes an emitter package with three groups of LEDs according to another embodiment of the present invention.

FIG. 13 illustrates an operating principle for tuning a lamp that includes an emitter package with three groups of LEDs according to another embodiment of the present invention. In this embodiment, the three groups of LEDs include a first cool white group 1302 with a color temperature "above" the blackbody curve (dashed line 1308), a second cool white group 1304 with a color temperature "below" blackbody curve 1308, and a warm white group 1306. By adjusting the relative current distributed to LED groups 1302, 1304, and 1306, the color can be tuned to any point within triangle 1310. In some embodiments, tuning to a range of points on blackbody curve 1308 (e.g., color temperatures of about 4500 K to about 2800 K) with high precision can be achieved. Thus, for example, a desired color temperature $(x_s, y_s)$ (point 1312) on blackbody curve 1308 can be produced by tuning.

Figure 14:
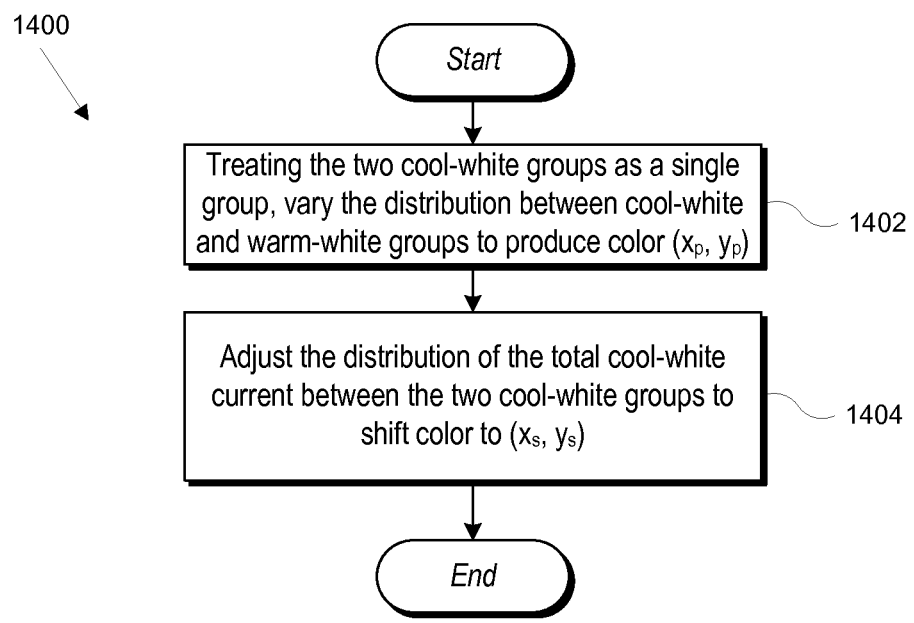
FIG. 14 illustrates a process for tuning a lamp having the LED groups illustrated in FIG. 13 according to an embodiment of the present invention.

FIG. 14 illustrates a process 1400 for tuning a lamp having the LED groups illustrated in FIG. 13 according to an embodiment of the present invention. At block 1402, the two cool-white LED groups 1302, 1304 are treated as a single group, and current is tuned between this "group" and warm-white LED group 1306 to produce a color temperature $(x_p, y_p)$ (point 1314) that is on the normal at point 1312 to blackbody curve 1308. For example, if $I_{C1}$ denotes the current delivered to cool white group 1302 and $I_{C2}$ denotes the current delivered to cool white group 1304, then at block 1402, the total current to the cool white LEDs $I_C = I_{C1} + I_{C2}$ can be divided such that $I_{C1} = I_{C2} = 0.5 * I_C$. A fixed total input current $I_{TOT}$ can be adjustably divided between $I_C$ and the current $I_W$ supplied to warm white group 1306 until the color corresponding to $(x_p, y_p)$ is reached. This determines operating currents $I_{CO}$ and $I_{WO}$.

Next, at block 1404, a division of the cool-LED current $I_{CO}$ between groups 1302 and 1304 is optimized. Holding $I_{CO}$ and $I_{WO}$ constant, $I_{C1}$ and $I_{C2}$ can be varied to shift the color toward the desired point $(x_s, y_s)$.

The embodiments of FIGS. 13 and 14 provide tuning to a single point on the blackbody curve with very good CRI. It should be noted that alternative embodiments are also possible. For example, instead of a lamp with two cool white groups and one warm white group, another embodiment can use a lamp with two warm white groups bracketing the blackbody curve (i.e., one group above and one group below) and one cool white group; the tuning process can be similar to that of FIG. 14.

Figure 15:
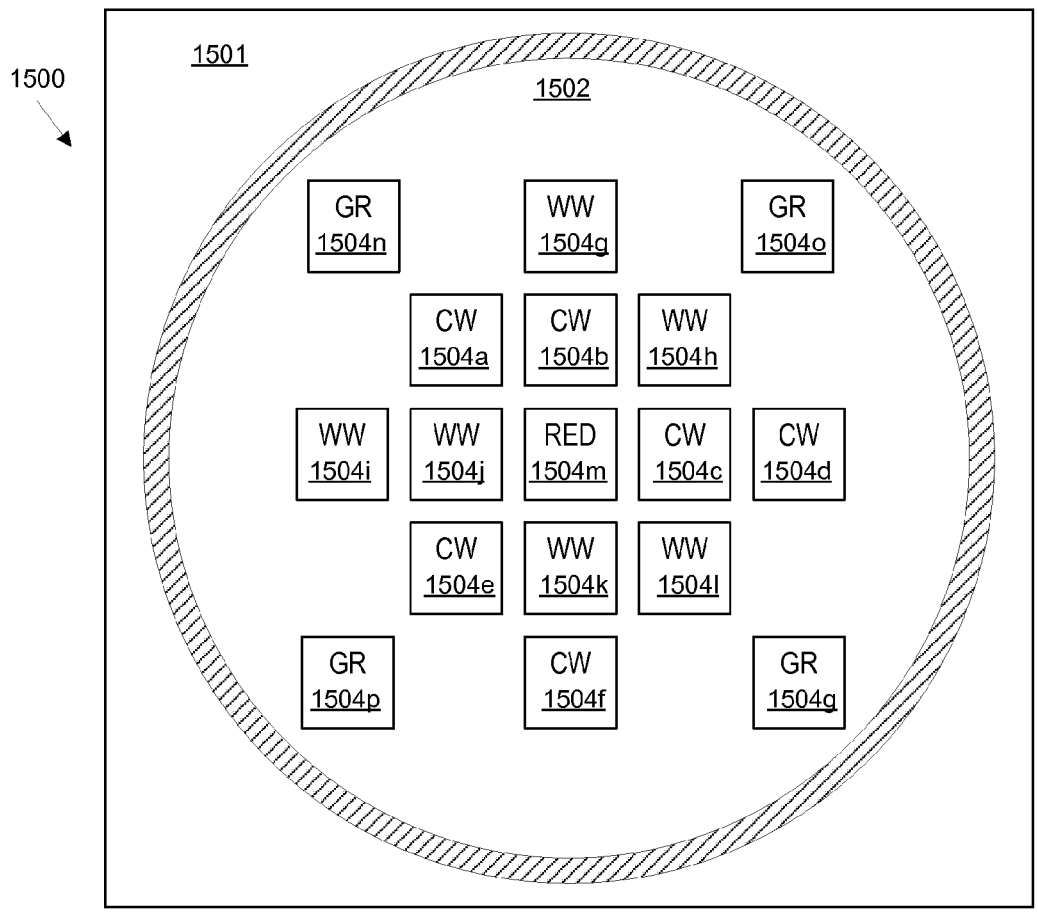
FIG. 15 is a top view of an LED emitter package with four groups of LEDs according to an embodiment of the present invention.

In some embodiments, more than three groups of LEDs can be used. For example, some embodiments may have two warm white groups (bracketing the blackbody curve) and two cool white groups (also bracketing the blackbody curve), for a total of four groups of LEDs. In still other embodiments, both red and green LED groups can be provided in addition to the warm white and cool white groups, thus providing four groups of LEDs. FIG. 15 is a top view of an LED emitter package 1500, in which a substrate 1501 has a recess 1502. Within recess 1502 are mounted six cool white (CW) LEDs 1504a-f, six warm white (WW) LEDs 1504g-l, one red LED 1504m, and four green LEDs 1504n-q, arranged as shown, thus providing four groups of LEDs. Those skilled in the art will appreciate that the number of LEDs in each group and/or the arrangement of LEDs can be modified as desired. Emitter package 1500 can be included in a lamp similar to lamp 100 of FIG. 1. In this example, the control circuitry and electrical couplings are such that the cool-white group, warm-white group, red group, and green group are each independently addressable, and the color of light emitted from the lamp can be tuned by adjusting the relative current delivered to each group.

Figure 16:
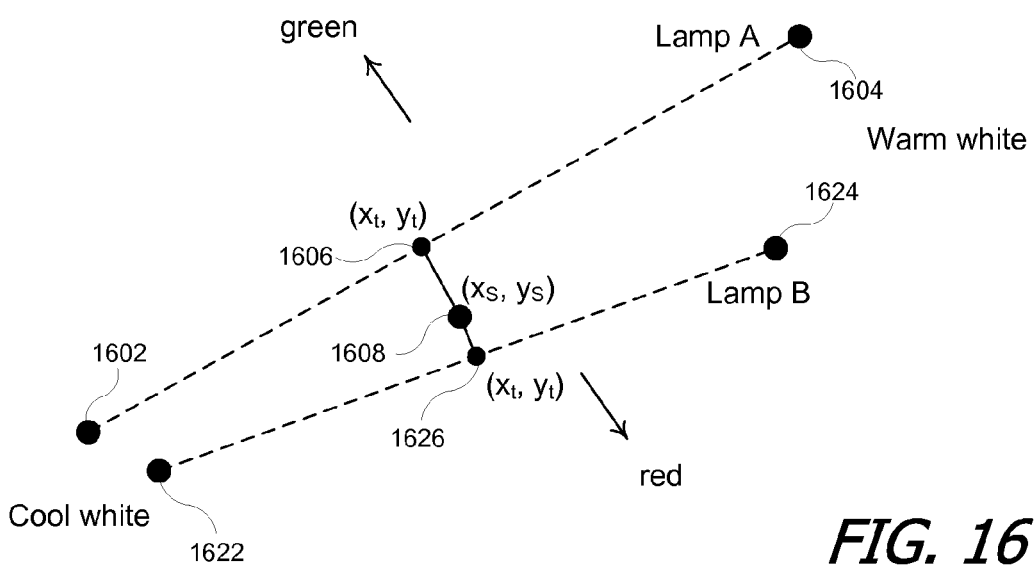
FIG. 16 illustrates an operating principle for tuning a lamp with four groups of LEDs according to an embodiment of the present invention.

FIG. 16 illustrates an operating principle for tuning a lamp with a four-group emitter package according to an embodiment of the present invention. For a first lamp (lamp A), the cool white LEDs produce light at point 1602 in color space while the warm white LEDs produce light at point 1604; a net white color $(x_{tA}, y_{tA})$ (point 1606) can be produced by tuning according to process 600. Target color point 1608 (coordinates $(x_s, y_s)$) lies on the blackbody curve, which for lamp A is below the net-white tuning line 1610. Thus, adding red to the net white color should bring it closer to point 1608. For a second lamp (lamp B), the cool white LEDs produce light at point 1622 in color space while the warm white LEDs produce light at point 1624; a net white color $(x_{tB}, y_{tB})$ (point 1626) can be produced by tuning according to process 600. Target color point 1608 (coordinates $(x_s, y_s)$) lies on the blackbody curve, which for lamp B is above the net-white tuning line 1630. Thus, adding green to the net white color should bring it closer to point 1608. Accordingly, providing both red and green LED groups allows for greater flexibility in tuning. In some embodiments, both red and green light can be added to the net white light to further fine-tune the color.

Figure 17:
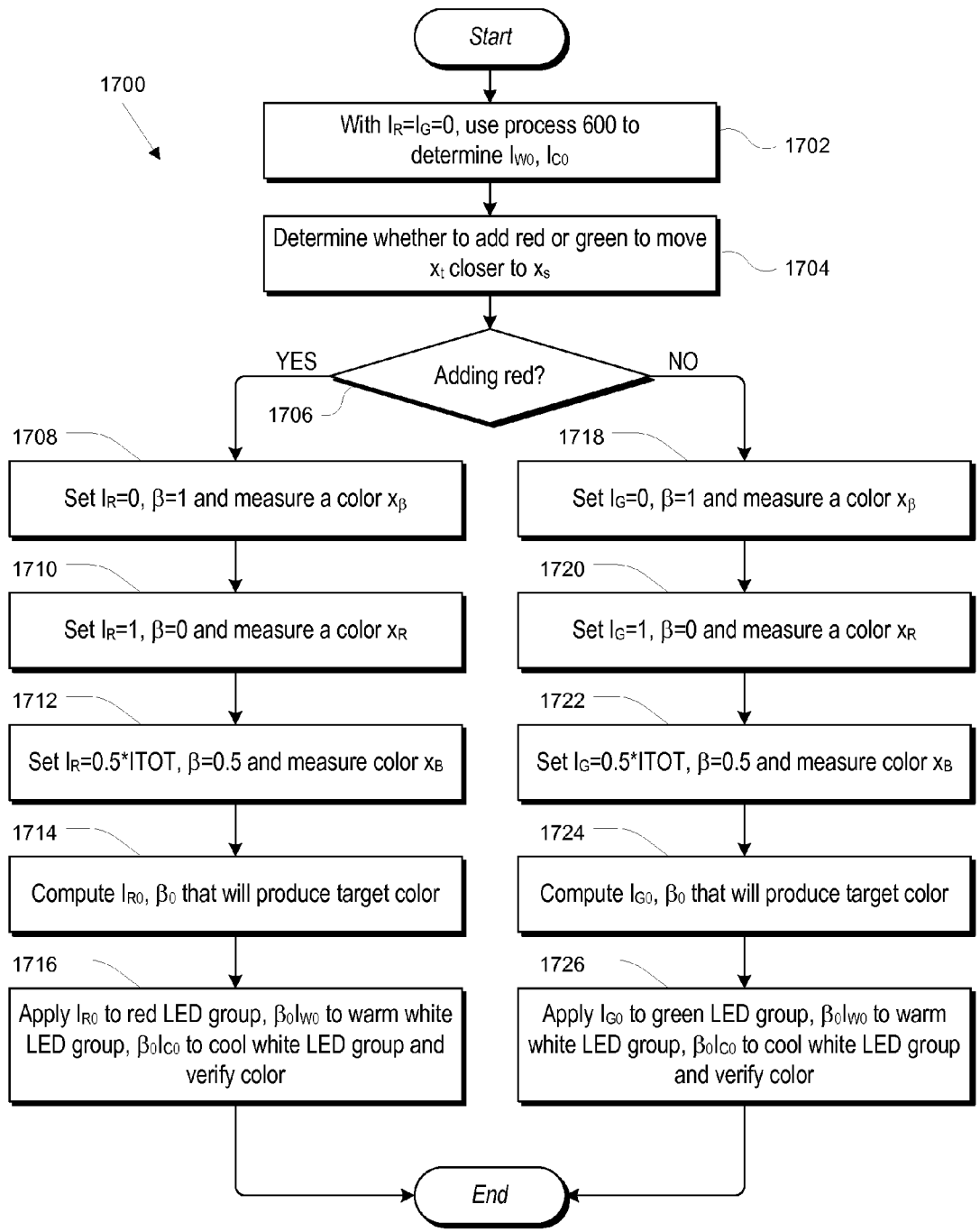
FIG. 17 illustrates a tuning process for a lamp with four groups of LEDs according to an embodiment of the present invention.

The process for tuning with four groups can be similar to process 1200 (FIG. 12). FIG. 17 illustrates a process 1700 that can be used according to an embodiment of the present invention. At block 1702, with $I_R$ and $I_G$ held constant at zero, process 600 (FIG. 6) can be used to determine $I_{W0}$ and $I_{C0}$, i.e., the division of current between the warm white and cool white LED groups that produces a net white color $(x_{t1}, y_{t1})$. At block 1704, by comparing $(x_{t1}, y_{t1})$ to the target color $(x_s, y_s)$, a determination is made as to whether red or green light should be added to fine-tune the color. After decision 1706, if red light is to be added, blocks 1708-1716 can be executed; these blocks can be similar to blocks 1204-1212 of process 1200 described above. If green light is to be added, blocks 1718-1726 can be executed. These blocks can be similar to blocks 1204-1212 of process 1200, with green light used in place of red.

It will be appreciated that the tuning processes for multiple groups of LEDs described herein are illustrative and that variations and modifications are possible. Any number of groups of LEDs can be provided, and tuning can be done by successively adding the next group to an optimal blend of previous groups, or by interpolating between multiple vertex locations associated with different mixtures of light from the different groups.

In some embodiments described above, an assumption is made that the change in color is linearly related to the change in relative currents between groups of LEDs when total current to all groups is held constant. This assumption works well for small regions in color space, particularly if the LEDs are chosen to have equal flux densities. In this case, an approach to tuning with two groups can include defining at least two reference points in color space, corresponding to at least two different distributions of a fixed total current between the groups of LEDs in a lamp, where the reference points are chosen such that the target color is intermediate between them, then applying linear interpolation to tune the current distribution such that the resulting light closely approximates the target color. Where more than two groups of LEDs are provided, at least three reference points in color space can be chosen such that the target color lies within a polygon (e.g., a triangle) defined by the reference points, and triangular interpolation and/or other interpolation techniques can be used to tune the current distribution such that the resulting light closely approximates the target color.

More generally, the change in color need not be linearly related to change in relative currents between the LED groups. Blending of light from independently-addressable LED groups having different colors or color temperatures can be used to tune a lamp regardless of whether the assumption of a linear relationship holds. In some cases where the assumption of linearity does not hold, the actual nonlinear response can be modeled for a family of lamps. Alternatively, a tuning algorithm can proceed by a "search" strategy that tests different divisions (or distributions) of currents among the LED groups and adjusts the current division iteratively based on color measurements. One search strategy can include shifting the current division by a fixed step size (e.g., 50 mA) between color measurements. Another search strategy can be based on a half-interval search technique, similar to a binary search. Starting from an assumption that the extremes of the current distribution bracket the target color temperature, the color temperature with an equal distribution of current can be measured. The next measurement can be taken with a current distribution halfway between equal and the extreme that should pull the result closer to the desired temperature, and this can be repeated until the desired color temperature is reached. A particular search strategy is not critical to the present invention.

In order to facilitate tuning, the total current applied to all groups is advantageously held constant during tuning; tuning is achieved by varying the distribution of the fixed total current to different groups (or, equivalently, the fraction of total current applied to each group).

The tuning processes described herein are straightforward and predictable, allowing for automated implementation, e.g., in a manufacturing environment. Examples of apparatus capable of implementing the tuning processes described herein will now be described.

Figure 18:
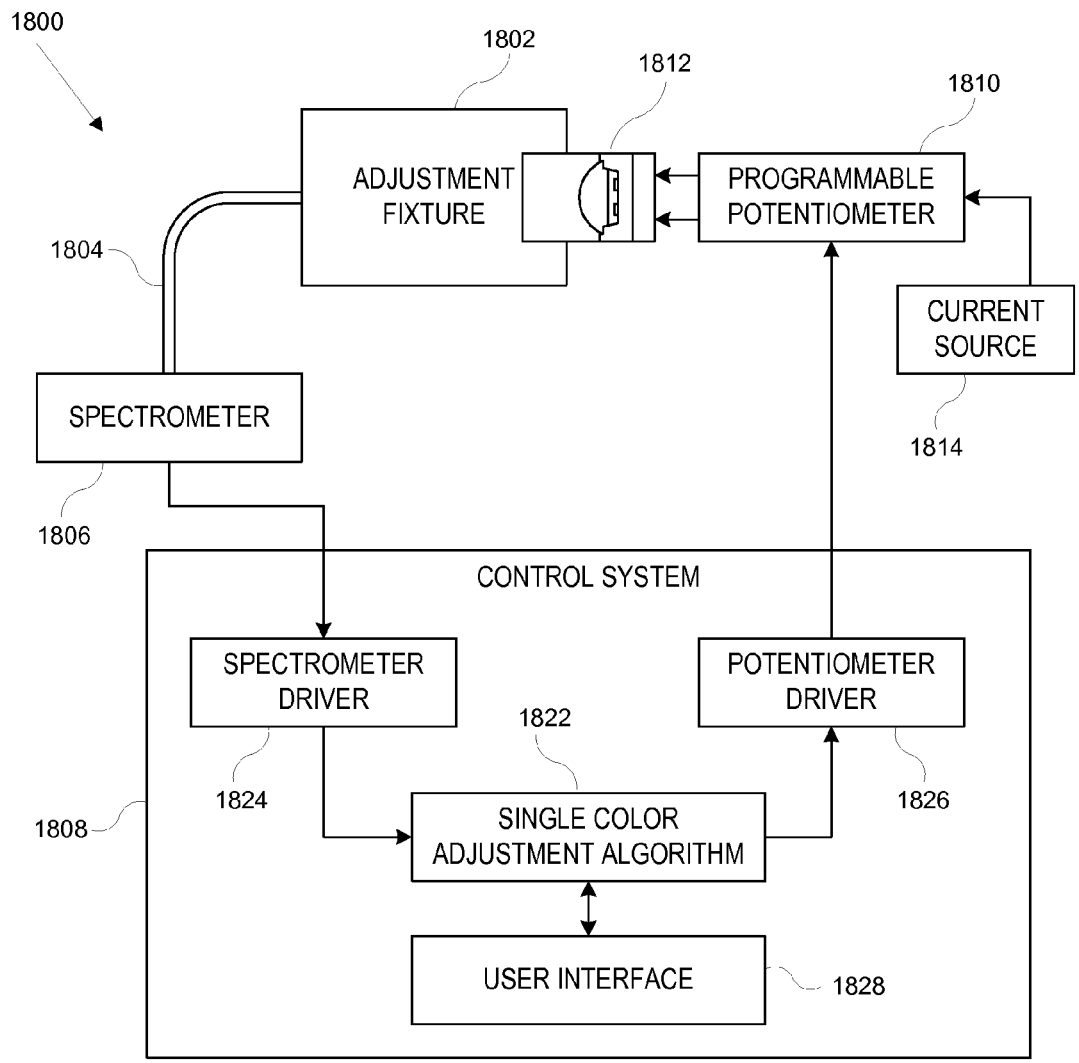
FIG. 18 is a simplified diagram of a tuning apparatus according to an embodiment of the present invention.

FIG. 18 is a simplified diagram of a tuning apparatus 1800 according to an embodiment of the present invention. Tuning apparatus 1800 includes an adjustment fixture 1802, an optical fiber 1804, a spectrometer 1806, a control system 1808, a programmable potentiometer 1810, and a current source 1818.

Adjustment fixture 1802 can incorporate mounting features for holding a lamp 1812 in place during tuning. Adjustment fixture 1802 also provides for delivery of light from lamp 1812 into optical fiber 1804 (e.g., a conventional optical fiber with a diameter of 100 microns). For example, adjustment fixture 1802 can include retention elements that hold optical fiber 1804 in position relative to lamp 1812 so that light from lamp 1812 falls onto the end of optical fiber 1804. In some embodiments, adjustment fixture 1802 can provide lenses or other optical elements, e.g., to focus the light from lamp 1812, thereby increasing the light incident on the end of optical fiber 1804.

Spectrometer 1806 can be of conventional design, such as the commercially available Ocean Optic USB4000 spectrometer. Any device capable of measuring light color and communicating its measurements to a computer can be used.

Programmable potentiometer 1810, which can also be of conventional design, can be connected to current input points of lamp 1812. Potentiometer 1810 can include variable resistors and the value of each resistor can be programmed, e.g., in response to a control signal. Potentiometer 1810 is advantageously arranged to apply resistances to divide an input current $I_{TOT}$ provided by current source 1818 into a current distribution for each group of LEDs in lamp 1812. For example, in the case where lamp 1812 includes cool white and warm white LEDs, $I_C$ can be delivered to the cool white LEDs while $I_W$ is delivered to the warm white LEDs in lamp 1812. For example, as shown in FIG. 2B, resistances $R_W$ and $R_C$ can be varied using a dual programmable potentiometer 1810. In one embodiment, potentiometer 1810 is programmed with the desired $R_W$ and $R_C$ values based on control signals received from control system 1808. Where lamp 1812 contains more than two groups, potentiometer 1810 can provide additional independently variable resistances so that the input current $I_{TOT}$ can be distributed in any arbitrary manner among the groups of LEDs. Other devices and techniques capable of controlling the distribution of an input current among the groups of LEDs can also be used; a potentiometer is not required.

Control system 1808 can be implemented using, e.g., using a computer system of conventional design, including a central processor (CPU), memory (e.g., RAM), display device, user input devices (keyboard, mouse, etc.), magnetic storage media (e.g., a hard or fixed disk drive), removable storage media (e.g., optical disc, flash-based memory cards), and the like. (In the interest of simplicity, these conventional components are not illustrated.) In one embodiment, control system 1808 is based on a Linux platform; however, a particular platform is not required. Control system 1808 can implement a single-color adjustment algorithm 1822, e.g., using program code that can be stored in memory and executed by the CPU. As described below, algorithm 1822 can implement aspects of process 600.

Control system 1808 can also implement a spectrometer driver 1824 that can receive color data from spectrometer 1806. In various embodiments, spectrometer driver 1824 can include a physical interface (e.g., Universal Serial Bus (USB) or the like) compatible with spectrometer 1806 and associated control software (executable by, e.g., a CPU or other processor of control system 1808) that can be used to direct the spectrometer to take readings and to provide data. In some embodiments, spectrometer driver 1824 in some embodiments can also provide code related to interpreting the data, e.g., converting measurements received from spectrometer 1806 into CIE color-space coordinates or other desired format.

Control system 1808 can also implement a potentiometer driver 1826 that can control operation of programmable potentiometer 1810. In various embodiments, potentiometer driver 1826 can include a physical interface (e.g., Universal Serial Bus (USB), I²C or the like) compatible with potentiometer 1810 and associated control software (executable, e.g., by a CPU or other processor of control system 1808) that can be used to instruct the potentiometer to set its variable resistances to specified values. The values can be specified by single-color adjustment algorithm 1822.

User interface 1828 can include standard interface components, such as a keyboard, mouse, track ball, track pad, touch pad, display screen, printer, etc., along with associated software executed by the CPU of control system 1808 to control and communicate with the interface components. Via user interface 1828, a user can communicate with single-color adjustment algorithm 1822 to control operation thereof. For example, the user can control starting and stopping of a tuning process and view data associated with tuning processes (e.g., plots similar to those of FIGS. 7A-7B).

Operation of apparatus 1800 can proceed as follows. First, an LED-based lamp 1812 (e.g., corresponding to lamp 100 of FIG. 1) is connected to potentiometer 1810 and placed into adjustment fixture 1802 such that light emitted by lamp 1812 is collected and delivered via optical fiber 1804 to spectrometer 1806. Next, control system 1808 is instructed to execute the single-color adjustment algorithm. This can include executing any of the processes described above to determine and apply selected currents to different LED groups and to measure the resulting light color. This setup can be used with any lamp 1812 capable of receiving separate currents for warm-white and cool-white LEDs. Once the light color produced by the operating currents has been verified as matching the target color (within manufacturing tolerances that can be chosen by the operator of apparatus 1800), lamp 1812 can be reconfigured (e.g., by adding resistors) such that the desired current division is obtained.

Figure 19:
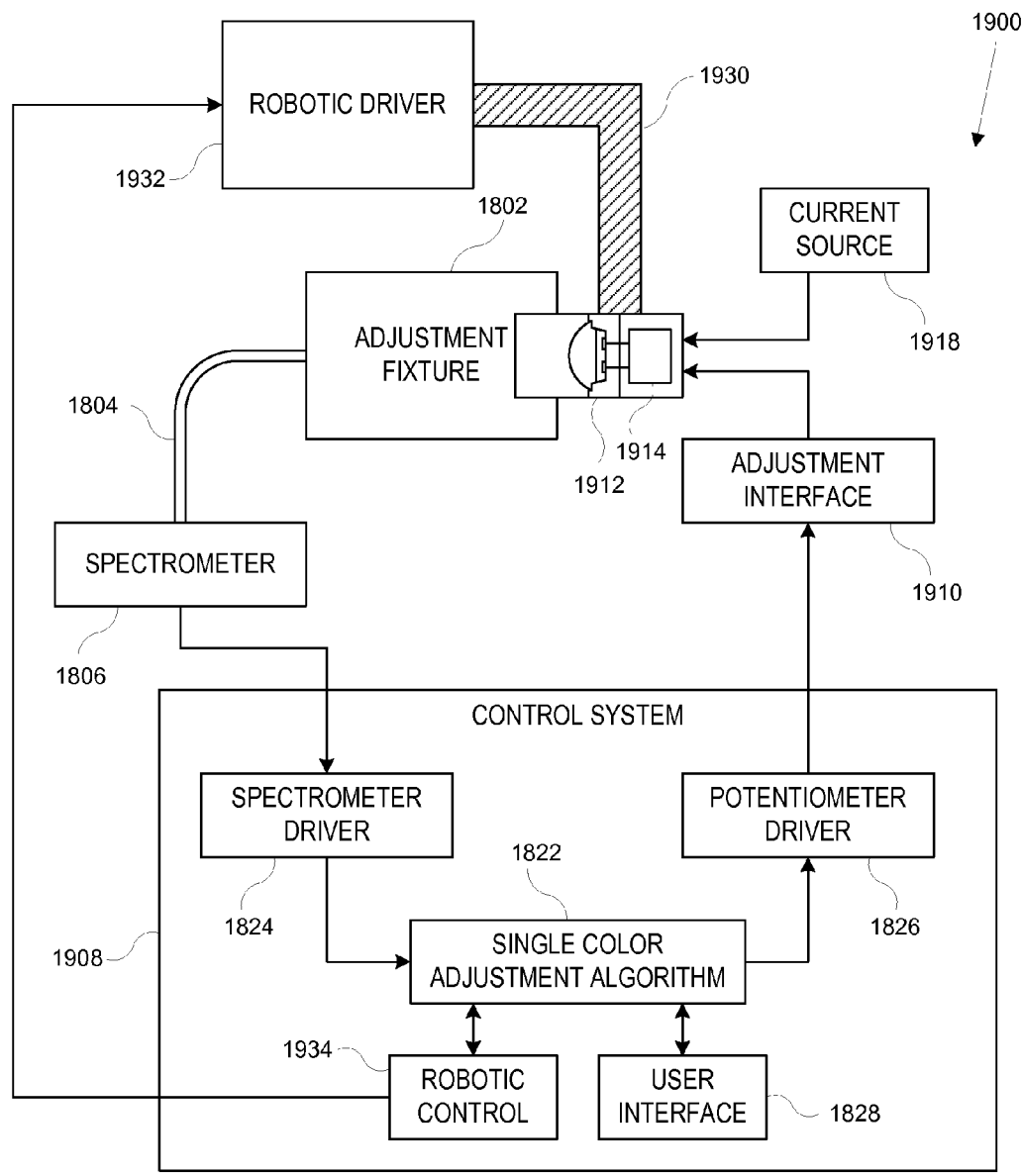
FIG. 19 shows a test apparatus that can be used to program potentiometers within a lamp according to an embodiment of the present invention.

Alternatively, in some embodiments, the lamp itself may include programmable potentiometers. For example, FIG. 19 shows a test apparatus 1900 that can be used to program potentiometers within a lamp according to an embodiment of the present invention. As indicated, most of the components of apparatus 1900 can be similar (or identical) to those of apparatus 1800. However, in this example, a lamp 1912, which can be otherwise similar to lamp 1812, includes potentiometer 1914 (or other control circuitry capable of controlling the amount of current delivered to each group of LEDs within lamp 1912), and an external adjustment interface 1910 replaces potentiometer 1810. An external power source 1918 is provided to deliver operating current $I_{TOT}$ to lamp 1912. Potentiometer 1914 can be configured with a suitable number of independently variable resistances; for instance, if lamp 1912 includes two groups of LEDs, potentiometer 1914 can be configured with variable resistances $R_W$ and $R_C$, e.g., corresponding to variable resistors 224, 226 shown in FIG. 2B. If lamp 1912 contains more than two groups, potentiometer 1914 can include additional independently variable resistances. Adjustment interface 1910 (which can be built into lamp 1912 or external to it) is capable of communicating with potentiometer 1914 to set the resistances to desired values in response to signals from potentiometer driver 1826.

Apparatus 1900 also includes a robotic arm 1930 that is operable by robotic driver 1932 to pick up a lamp (e.g., lamp 1912) from a location holding lamps to be tuned and place lamp 1912 into adjustment fixture 1802. Robotic arm 1930 is further operable by robotic driver 1932 to remove lamp 1912 from adjustment fixture 1802 after tuning and place lamp 1912 into a location designated for holding tuned lamps. Robotic driver 1932 can be controlled by a suitable robotic-control subsystem 1934, which can be implemented using hardware and/or software incorporated into control system 1908. Conventional techniques for robotic control systems can be used to implement robotic arm 1930, driver 1932 and control subsystem 1934. In some embodiments, adjustment fixture 1802 may include movable members that extend to hold lamp 1912 in place and retract to release lamp 1912. Such members can also be operated under control of robotic driver 1932, allowing full automation of the process of inserting lamps into the adjustment fixture for tuning and removing them when tuning is complete.

Apparatus 1900 allows for a fully automated tuning procedure, in which a lamp 1912 is inserted into adjustment fixture 1802 and connected to adjustment interface 1910. Robotic arm 1930 can be used to remove human intervention from the process of inserting and removing lamps from the adjustment fixture. Control system 1908, which can include components similar to those of control system 1808 of FIG. 18 described above, can execute the tuning process to determine operating currents and program potentiometer 1914 with the appropriate resistances to produce the desired operating currents. Thereafter, lamp 1912 can be removed from apparatus 1900. Again, robotic arm 1930 can be used to remove human intervention from this stage. Potentiometer 1914 advantageously retains its last programmed settings when disconnected from adjustment interface 1910; consequently, lamp 1912 will continue provide the desired operating currents to the warm-white and cool-white LEDs even after being removed from the test fixture. Thus, lamps can be tuned with little or no manual intervention, and multiple lamps can be tuned at once, e.g., by providing multiple copies of all or part of apparatus 1900.

Figure 20:
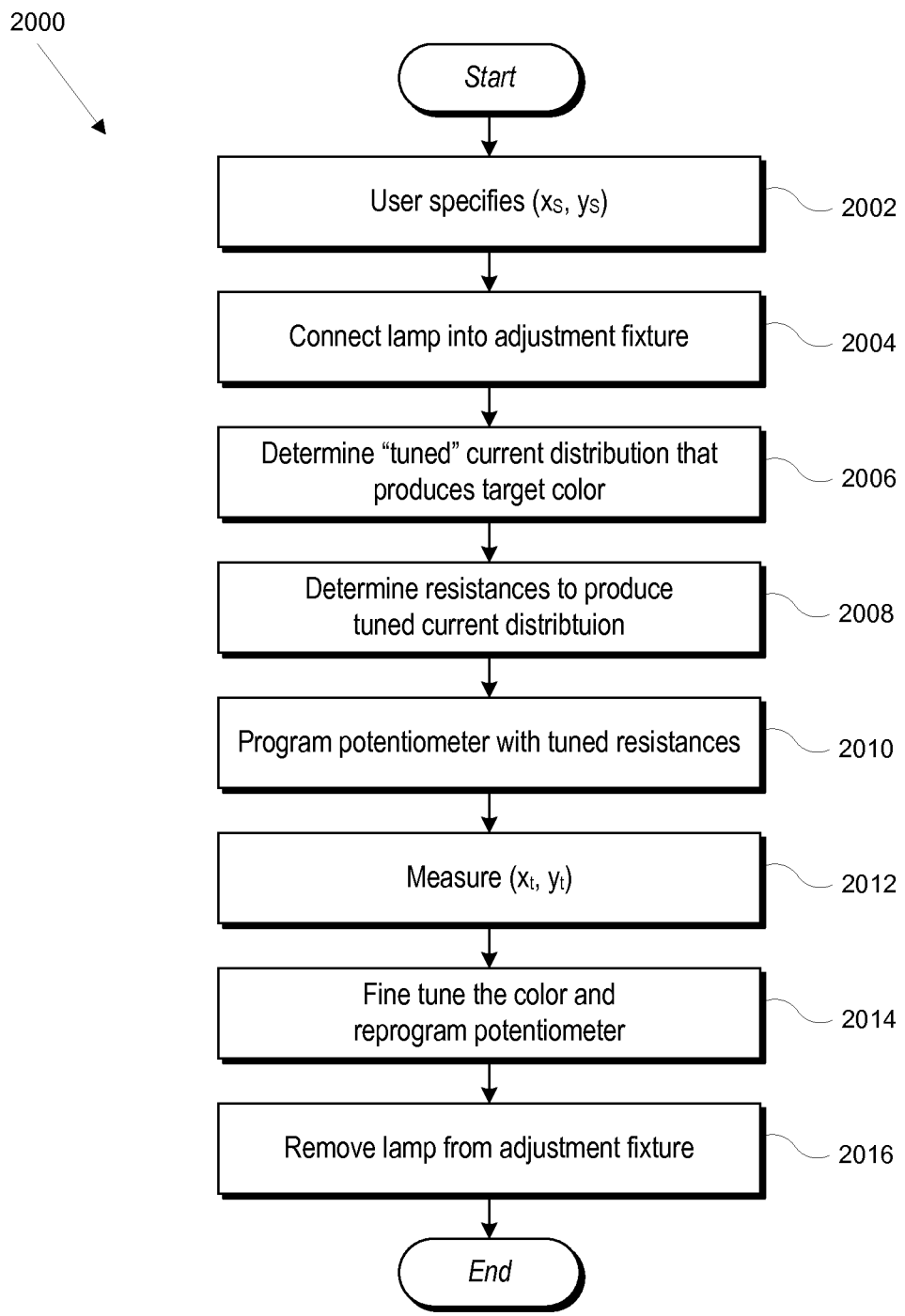
FIG. 20 illustrates a tuning process according to an embodiment of the present invention.

FIG. 20 illustrates a tuning process 2000 that can be implemented, e.g., in apparatus 1900 according to an embodiment of the present invention. Tuning process 2000 can be used to tune a single lamp or any number of lamps. At block 2002, a user specifies the desired color $(x_s, y_s)$, e.g., by interacting with user interface 1828 of control system 1808. In some embodiments, the user can specify a desired color temperature, which control system 1808 can convert to color-space coordinates. At block 2004, a lamp (e.g., lamp 1912) is connected into adjustment fixture 1802, e.g., by the user, by some other operator of apparatus 1900, or by a robotic mechanism in an automated manufacturing plant.

At block 2006, control system 1808 operates apparatus 1900 to determine a current distribution that produces the desired color. For example, single-color adjustment algorithm 1822, which can implement any of the tuning processes described above, can be executed to determine a distribution of a total current among the groups of LEDs in lamp 1912 that produces the desired color. At block 2008, operating resistances for potentiometer 1914 that produce the desired current distribution are determined. For example, in one embodiment with two groups of LEDs, the principle that $I_W/I_C = R_C/R_W$ can be used together with the operating currents $I_{W0}$ and $I_{C0}$ (determined at block 2006) to select appropriate resistances. This computation can be incorporated into single-color adjustment algorithm 1822. At block 2010, potentiometer 1914 is programmed with the operating resistances determined at block 2008; for instance, single-color adjustment algorithm 1822 can communicate the operating resistances to potentiometer driver 1826, which communicates the resistances to potentiometer 1914 via adjustment interface 1910.

At block 2012, the operating currents can be tested by measuring the operating color $(x_0, y_0)$ while lamp 1912 remains in adjustment fixture 1802. In some embodiments, at block 2014, the color can be fine-tuned with a further adjustment, e.g., in response to the measurement at block 2012 and a least-squares fit to a blackbody curve.

At block 2016, after the final tuning is completed, lamp 1912 can be removed from adjustment fixture 1802. Potentiometer 1914 advantageously remains programmed with the operating resistances determined in process 2000 so that lamp 1912 will produce light of the tuned color whenever operating power is supplied.

After block 2016, process 2000 can end. In some embodiments, additional lamps can be tuned to the same color temperature by repeating process 2000 (starting from block 2004) for each lamp.

It will be appreciated that the process 2000 described herein is illustrative and that variations and modifications are possible. Steps described as sequential may be executed in parallel, order of steps may be varied, and steps may be modified, combined, added or omitted. A similar process can be used with apparatus 1800 of FIG. 18. In some embodiments, it may be desirable to tune a single lamp for each of a number of different color temperatures and provide a control on the lamp that a user can operate to select among these color temperatures. This can be accomplished by repeating process 2000 for each desired color temperature and storing the operating resistances determined for each temperature (e.g., in a lookup table). When the user selects a color temperature by operating the control on the lamp, the corresponding resistances can be looked up and programmed into potentiometer 1914.

It should be noted that in ordinary use (after process 2000), lamp 1912 does not require any feedback mechanism to preserve the color tuning Potentiometer 1914 can remain in its programmed state for the life of the lamp, delivering the desired currents to keep the color tuned. The color will not shift as long as the LEDs within lamp 1912 remain color-stable throughout their lifetime. White LEDs capable of lifetime color stability to within acceptable tolerances are known and can be used in lamp 1912 or other lamps described here. Thus, there is no need for an active feedback process during ordinary use of the lamp and no need for a color sensor that is stable over the lifetime of the lamp. Accordingly, an external active feedback loop, e.g., as shown in FIGS. 18 and 19, can be used for initial tuning of the lamp, and the lamp can thereafter be operated without further feedback or tuning In some embodiments, lamp 1912 can include control circuitry to maintain a desired distribution of an input current to the different groups of LEDs. For example, programmable potentiometers can be used as described above. Once the current is tuned, the programmable potentiometers can store the resistance values corresponding to the desired color. In other embodiments, the lamp can include memory circuits (e.g., programmable read-only memory, flash memory or the like) that can store information indicating the desired distribution of current. Thus, for example, a fixture in which the lamp is installed can include a current controller capable of reading the stored information and providing input currents to each group of LEDs based on the desired distribution. Other techniques can also be used to store or retain the tuning information (e.g., the desired current distribution) within a lamp. In some embodiments, the lamp may be capable of operating at a user-selectable one of a number of different target colors (or color temperatures), e.g., by use of an external control switch to select a color or the like. The tuning process can be modified to determine a distribution of input current to produce each target color, and the lamp can store information indicating the distribution associated with each color; in operation, the lamp can retrieve the desired distribution based on the setting of the control switch.

Further, since ordinary use of lamp 1912 does not require a feedback loop, the various components of the feedback loop used for tuning can be external to lamp 1912 and removed after tuning, as is the case for apparatus 1900 of FIG. 19. This can reduce the costs of manufacture of the lamp relative to a lamp that relies on active feedback during ordinary use. Further, operating cost of the lamp may also be somewhat reduced, as there are no feedback components consuming power during ordinary use.

While the invention has been described with respect to specific embodiments, one skilled in the art will recognize that numerous modifications are possible. For example, the invention is not limited to a particular lamp geometry or form factor or as to the number and type of LEDs. The particular current values and tuning constant values mentioned herein are also illustrative, and other values may be substituted. The number of groups of LEDs, number of LEDs in any group, and/or the color of a group can be varied. In general, a tunable lamp will include at least two groups of LEDs, with each group occupying a non-overlapping region in color space. The size of the region will depend in part on the manufacturing processes and tolerances used to produce the different groups of LEDs; where a group includes multiple LEDs, those LEDs can be randomly scattered within the associated color-space region. The regions allowed for different groups are advantageously chosen such that the desired (tuned) color is intermediate between the regions occupied by the different LED groups.

Thus, although the invention has been described with respect to specific embodiments, it will be appreciated that the invention is intended to cover all modifications and equivalents within the scope of the following claims.

What is claimed is:

1. An apparatus for tuning a color produced by a lamp having a plurality of light-emitting diodes (LEDs) including a plurality of groups of LEDs wherein each group of LEDs produces light having a different color and wherein a current applied to each group of LEDs is independently variable, the apparatus comprising:

an adjustment fixture configured to hold the lamp;
a spectrometer configured to detect and measure a color of light produced by the lamp;
a current supply subsystem configured to deliver a current to each one of the groups of LEDs, wherein the current delivered to each one of the groups of LEDs is independently variable; and
a control system coupled to the spectrometer and the current supply subsystem, the control system configured to receive the measured light color from the spectrometer and to provide a current controlling signal to the current control circuit,
wherein the control system includes a control processor configured to:
 operate the current supply subsystem and the spectrometer to make at least two initial measurements of the color of the light, for at least two different testing distributions of a total current among the groups of LEDs; and
 determine, based on the at least two initial measurements, a target distribution of the total current among the groups of LEDs, wherein the target distribution of the total current causes the lamp to produce light having a color closely approximating a target color.

2. The apparatus of claim 1 wherein the control processor is further configured to instruct the current supply subsystem to provide the target distribution of the total current to the groups of LEDs.

3. The apparatus of claim 1 further comprising:
a robotic system configured to place the lamp into the adjustment fixture and to remove the lamp from the adjustment fixture,
wherein the control system is further configured to operate the robotic system.

4. The apparatus of claim 1 wherein the current supply subsystem includes:
a current source configured to produce the total current; and
a programmable potentiometer coupled to the current source and configured to distribute the total current among a plurality of current inputs to the lamp, wherein each current input is associated with a different one of the groups of LEDs.

5. The apparatus of claim 1 wherein the lamp includes a total internal reflection lens to mix the light produced by the plurality of LEDs and wherein the spectrometer is configured to receive light exiting from a front face of the total internal reflection lens.

6. The apparatus of claim 1 wherein the at least two initial measurements include:
a first measurement made at a time when all of the total current is supplied to a first one of the groups of LEDs and no current is supplied to any other of the groups of LEDs; and
a second measurement made at a time when all of the total current is supplied to a second one of the groups of LEDs and no current is supplied to any other of the groups of LEDs.

7. The apparatus of claim 6 wherein the at least two initial measurements further include a third measurement made at a time when an approximately equal fraction of the total current is provided to each of the groups of LEDs.

8. The apparatus of claim 7 wherein the control circuit is further configured such that determining the target distribution of the total current includes computing an approximation to the target distribution of the total current based on the first, second, and third measurements.

9. An apparatus for tuning a color produced by a lamp having a plurality of light-emitting diodes (LEDs) including a plurality of independently-addressable groups of LEDs wherein each group of LEDs produces light having a different color and an onboard control unit capable of providing a variable current to each of the groups of LEDs, the apparatus comprising:
  an adjustment fixture configured to hold the lamp;
  a spectrometer configured to detect and measure a color of light produced by the lamp;
  a current source configured to be connected to the lamp and to deliver a current to the onboard control unit of the lamp; and
  a control system configured to be coupled to the spectrometer, the current source, and the onboard control unit of the lamp, the control system being configured to receive the measured light color from the spectrometer and to provide a current controlling signal to the onboard control unit of the lamp,
  wherein the control system includes a control processor configured to:
    operate the spectrometer, the current source, and the onboard control unit of the lamp to make at least two initial measurements of the color of the light, for at least two different testing distributions of a total current among the groups of LEDs;
    determine, based on the at least two initial measurements, a target distribution of the total current among the groups of LEDs, wherein the target distribution of the total current causes the lamp to produce light having a color closely approximating a target color; and
    communicate information indicative of the target distribution to the onboard control unit of the lamp.

10. The apparatus of claim 9 wherein the onboard control unit of the lamp is further configured to store the information indicative of the target distribution.

11. The apparatus of claim 9 further comprising:
  a robotic system configured to place the lamp into the adjustment fixture and to remove the lamp from the adjustment fixture,
  wherein the control system is further configured to operate the robotic system.

12. The apparatus of claim 9 wherein the lamp includes a total internal reflection lens to mix the light produced by the plurality of LEDs and wherein the spectrometer is configured to receive light exiting from a front face of the total internal reflection lens.

13. The apparatus of claim 9 wherein the plurality of independently-addressable groups of LEDs includes a group of warm white LEDs associated with a first color temperature and a group of cool white LEDs associated with a second color temperature, and wherein the target color corresponds to a color temperature intermediate between the first color temperature and the second color temperature.

14. The apparatus of claim 9 wherein the plurality of independently-addressable groups of LEDs includes at least three groups of white LEDs, each group producing light of a different color, and wherein the target color corresponds to a point on a blackbody curve in a color space.

15. An apparatus for tuning a color produced by a lamp having a plurality of light-emitting diodes (LEDs), including a plurality of warm white LEDs and a plurality of cool white LEDs, and an onboard control unit capable of independently providing a first current to the warm white LEDs and a second current to the cool white LEDs, the apparatus comprising:
  an adjustment fixture configured to hold the lamp;
  a spectrometer configured to detect and measure a color of light produced by the lamp;
  an external control device configured to communicate with the onboard control unit of the lamp;
  a control system coupled to the spectrometer and the external control device, the control system configured to receive the measured light color from the spectrometer and to provide a current controlling signal to the external control device,
  wherein the control system is configured to:
    operate the external control device and the spectrometer to make at least two initial measurements of the color of the light, for at least two different testing values of the first current and the second current;
    compute, based on the at least two initial measurements, a target value for each of the first current and the second current; and
    instruct the external control device to set the onboard control unit to provide the target value of the first current to the warm white LEDs and to provide the target value of the second current to the cool white LEDs.

16. The apparatus of claim 15 further comprising:
  a robotic system configured to place the lamp into the adjustment fixture and to remove the lamp from the adjustment fixture,
  wherein the control system is further configured to operate the robotic system.

17. The apparatus of claim 15 wherein the at least two initial measurements include:
  a first measurement made at a time when all of the total current is supplied to the cool white LEDs and no current is supplied to the warm white LEDs; and
  a second measurement made at a time when all of the total current is supplied to the warm white LEDs and no current is supplied to the cool white LEDs.

18. The apparatus of claim 17 wherein the at least two initial measurements further include a third measurement made at a time when approximately half of the total current is provided to the warm white LEDs and approximately half of the total current is provided to the cool white LEDs.

19. The apparatus of claim 18 wherein the control circuit is further configured such that determining the target distribution of the total current includes computing an approximation to the target distribution of the total current based on the first, second, and third measurements.

20. The apparatus of claim 19 wherein computing the approximation includes using a linear interpolation algorithm based on a difference between the third measurement and a target color.

* * * * *